US012596452B2

(12) United States Patent
Cho

(10) Patent No.: US 12,596,452 B2
(45) Date of Patent: Apr. 7, 2026

(54) ELECTRONIC DEVICE

(71) Applicant: Samsung Display Co., Ltd., Yongin-si (KR)

(72) Inventor: Maeum Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 18/610,128

(22) Filed: Mar. 19, 2024

(65) Prior Publication Data

US 2025/0053259 A1 Feb. 13, 2025

(30) Foreign Application Priority Data

Aug. 11, 2023 (KR) ........................ 10-2023-0105815

(51) Int. Cl.
| | |
|---|---|
| *G06F 3/041* | (2006.01) |
| *G06F 3/0354* | (2013.01) |
| *G06F 3/044* | (2006.01) |
| *G06F 3/046* | (2006.01) |
| *H10K 59/40* | (2023.01) |

(52) U.S. Cl.
CPC ...... *G06F 3/04164* (2019.05); *G06F 3/03545* (2013.01); *G06F 3/0412* (2013.01); *G06F 3/044* (2013.01); *G06F 3/0448* (2019.05); *G06F 3/046* (2013.01); *H10K 59/40* (2023.02); *G06F 2203/04111* (2013.01)

(58) Field of Classification Search
CPC .............. G06F 3/04164; G06F 3/0448; G06F 3/03545; G06F 3/0412; G06F 3/044; G06F 3/046; G06F 2203/04111; H10K 59/40
See application file for complete search history.

(56) References Cited

U.S. PATENT DOCUMENTS

| | | | |
|---|---|---|---|
| 9,639,220 B2 | 5/2017 | Wang | |
| 10,032,061 B2 * | 7/2018 | Chia ................. | G06F 3/041661 |
| 10,146,336 B2 | 12/2018 | Lee et al. | |
| 11,650,695 B2 | 5/2023 | Lim | |
| 2014/0247238 A1 * | 9/2014 | Chang .................. | G06F 3/0346 |
| | | | 345/174 |
| 2017/0206393 A1 * | 7/2017 | Chia ....................... | G06F 3/043 |
| 2024/0211069 A1 * | 6/2024 | Wang .................... | G06F 3/0443 |

FOREIGN PATENT DOCUMENTS

KR 10-2023-0023857 A 2/2023

* cited by examiner

*Primary Examiner* — Peter D Mcloone
(74) *Attorney, Agent, or Firm* — Womble Bond Dickinson (US) LLP

(57) ABSTRACT

An electronic device includes: a display panel including a display region including pixels, and a non-display region adjacent to the display region; and an input sensor on the display panel. The input sensor includes: a first sensor layer to sense an external input using an electromagnetic induction method, and including first group electrodes; a second sensor layer to sense an external input using a capacitance method, and including second group electrodes insulated from the first group electrodes; a pad part including pads overlapping with the non-display region; first signal lines connected to the first group electrodes and the pads; and second signal lines connected to the second group electrodes and the pads. At least some of the first signal lines and the second signal lines overlap with the display region.

20 Claims, 19 Drawing Sheets

ELECTRONIC DEVICE

CROSS-REFERENCE TO RELATED APPLICATIONS

The present application claims priority to and the benefit of Korean Patent Application No. 10-2023-0105815, filed on Aug. 11, 2023, in the Korean Intellectual Property Office, the entire disclosure of which is incorporated by reference herein.

BACKGROUND

1. Field

Aspects of embodiments of the present disclosure relate to an electronic device including an input sensor for sensing different kinds of external inputs.

2. Description of the Related Art

Various display devices for use in multimedia devices, such as mobile phones, tablet computers, car navigation units, game machines, and the like, are being developed. The display devices include a keyboard or a mouse as an input device. Alternatively, the display devices include an input sensor as an input device.

The input sensor may sense a user input using a capacitance method, or may sense an input of a stylus pen using an electromagnetic induction method.

SUMMARY

One or more embodiments of the present disclosure may be directed to an electronic device having improved input sensor efficiency and a reduced dead space.

However, the present disclosure is not limited to the above aspects and features. Additional aspects and features will be set forth, in part, in the description that follows, and in part, may be apparent from the description, or may be learned by practicing one or more of the presented embodiments of the present disclosure.

According to one or more embodiments of the present disclosure, an electronic device includes: a display panel including a display region including pixels, and a non-display region adjacent to the display region; and an input sensor on the display panel. The input sensor includes: a first sensor layer configured to sense an external input using an electromagnetic induction method, and including first group electrodes; a second sensor layer configured to sense an external input using a capacitance method, and including second group electrodes insulated from the first group electrodes; a pad part including pads overlapping with the non-display region; first signal lines connected to the first group electrodes and the pads; and second signal lines connected to the second group electrodes and the pads. At least some of the first signal lines and the second signal lines overlap with the display region.

In an embodiment, the first group electrodes may include: first-first electrodes located along a first direction, each of the first-first electrodes including: first-first sensing patterns located along a second direction crossing the first direction; and first bridge patterns configured to connect the first-first sensing patterns that are adjacent to each other to each other; and first-second electrodes insulated from the first-first electrodes, and located along the second direction, each of the first-second electrodes extending in the first direction. The first signal lines may include first-first signal lines configured to at least partially overlap with the display region, and first-second signal lines configured to overlap with the non-display region. The first-first signal lines may be connected to the first-second electrodes.

In an embodiment, the second group electrodes may include: second-first electrodes located along the first direction, each of the second-first electrodes including second-first sensing patterns located along the second direction, and second bridge patterns configured to connect the second-first sensing patterns that are adjacent to each other to each other; second-second electrodes insulated from the second-first electrodes, and located along the second direction, each of the second-second electrodes extending in the first direction; and second-third electrodes located along the second direction, and inside the second-second electrodes in a plan view, each of the second-third electrodes extending in the first direction. The second signal lines may include second-first signal lines configured to at least partially overlap with the display region, and second-second signal lines configured to overlap with the non-display region. Some of the second-first signal lines may be connected to the second-second electrodes, and others of the second-first signal lines may be connected to the second-third electrodes.

In an embodiment, the input sensor may further include: a first insulating layer on the display panel; a second insulating layer on the first insulating layer; a third insulating layer on the second insulating layer; and a fourth insulating layer on the third insulating layer. The first-first signal lines and the second-first signal lines may be on the first insulating layer, and may be covered by the second insulating layer.

In an embodiment, the first bridge patterns and the second bridge patterns may be on the first insulating layer, and may be covered by the second insulating layer.

In an embodiment, the first-first sensing patterns and the first-second electrodes may be on the second insulating layer, and may be covered by the third insulating layer. The first-first sensing patterns may be connected with the first bridge patterns through contact holes defined in the second insulating layer.

In an embodiment, the second-first sensing patterns, the second-second electrodes, and the second-third electrodes may be on the third insulating layer, and may be covered by the fourth insulating layer. The second-first sensing patterns may be connected with the second bridge patterns through contact holes defined in the second insulating layer and the third insulating layer.

In an embodiment, each of the second-first sensing patterns, the second-second electrodes, and the second-third electrodes may include conductive lines configured to cross each other, and the conductive lines may have openings defined therein to overlap with emissive regions through which light generated by the pixels is provided.

In an embodiment, each of the first-first electrodes may include one side adjacent to the pad part, and an opposite side facing away from the one side. One of the first-second signal lines may be connected to the opposite side of each of the first-first electrodes.

In an embodiment, the electronic device may further include connecting portions configured to connect sides of the first-first electrodes that are adjacent to each other in the first direction from among the first-first electrodes to each other.

In an embodiment, the first-first signal lines and the second-first signal lines located between the second-first electrodes that are adjacent to each other in the first direction may be defined as one line group from among a plurality of line groups, and numbers of the first-first signal lines and the second-first signal lines included in each of the plurality of line groups may be greater than or equal to 5.

In an embodiment, each of the plurality of line groups may include: a first left line and a first right line connected to one of the first-second electrodes, and spaced from each other in the first direction; a second left line and a second right line connected to a second-second electrode from among the second-second electrodes configured to surround one of the first-second electrodes, the second left line and the second right line being located between the first left line and the first right line; and a center line connected to a second-third electrode from among the second-third electrodes surrounded by one of the first-second electrodes, the center line being located between the second left line and the second right line.

In an embodiment, the center lines included in the plurality of line groups may have different widths from each other in the second direction.

In an embodiment, the second-first sensing patterns, the second-second electrodes, and the second-third electrodes may be on the second insulating layer, and may be covered by the third insulating layer. The second-first sensing patterns may be connected with the second bridge patterns through contact holes defined in the second insulating layer.

In an embodiment, the first-first sensing patterns and the first-second electrodes may be on the third insulating layer, and may be covered by the fourth insulating layer. The first-first sensing patterns may be connected with the first bridge patterns through contact holes defined in the second insulating layer and the third insulating layer.

In an embodiment, each of the first-second electrodes may have an open loop shape, and may overlap with a second-third electrode corresponding thereto from among the second-third electrodes in a plan view, and a recess configured to extend in the first direction may be defined in each of the first-second electrodes.

In an embodiment, each of the second-second electrodes may have an open loop shape, and may overlap with a first-second electrode corresponding thereto from among the first-second electrodes in a plan view, and a recess configured to extend in the first direction may be defined in each of the second-second electrodes.

In an embodiment, each of the second-first electrodes may have an open loop shape, and may overlap with a first-first electrode corresponding thereto from among the first-first electrodes in a plan view, and a recess configured to extend in the second direction may be defined in each of the second-first electrodes.

In an embodiment, each of the first group electrodes and the second group electrodes may include first to third layers that are sequentially stacked one above another, the first layer and the third layer having a smaller thickness than that of the second layer. The first layer and the third layer may include titanium, and the second layer may include aluminum.

In an embodiment, the first sensor layer may be configured to sense the external input provided from a stylus pen including a resonance circuit.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1A:
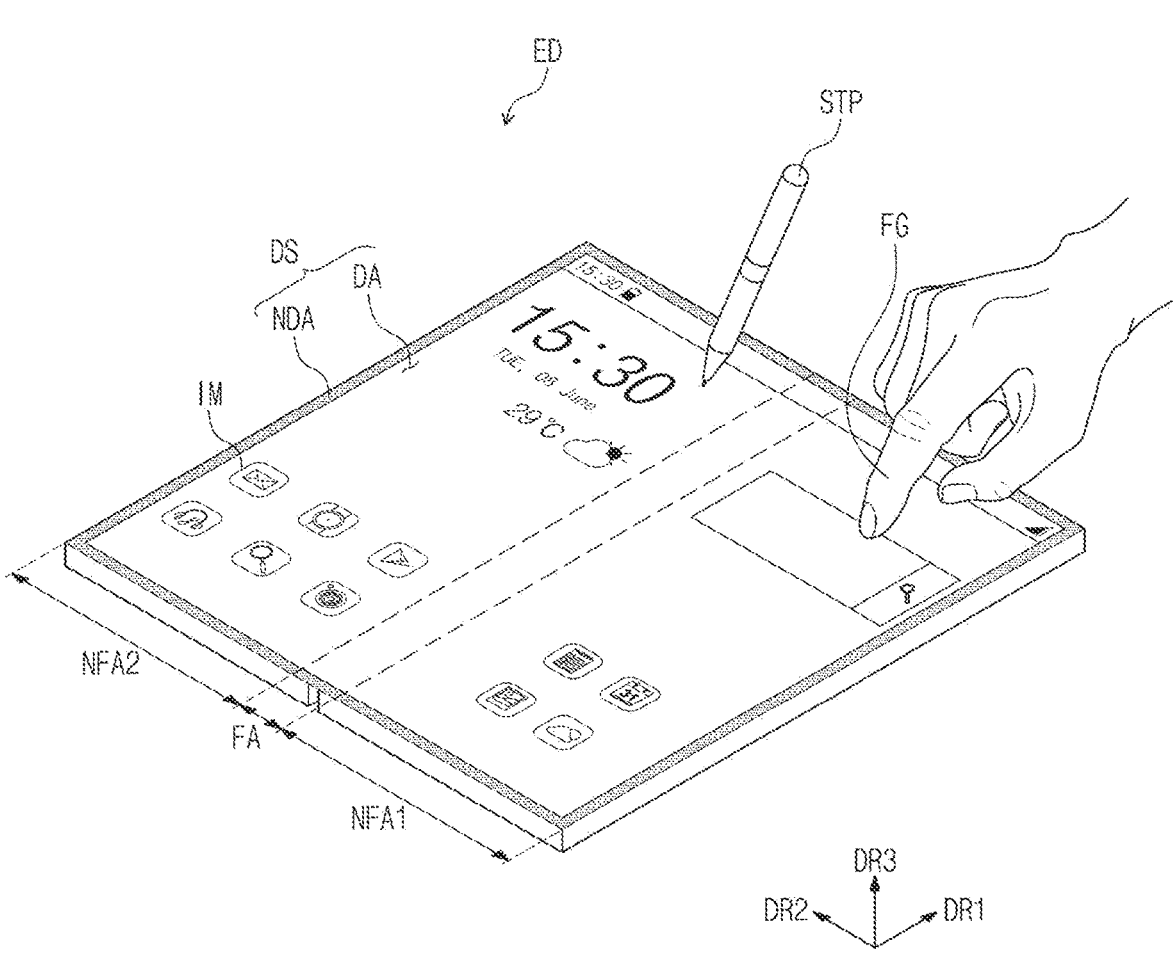
FIG. 1A is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
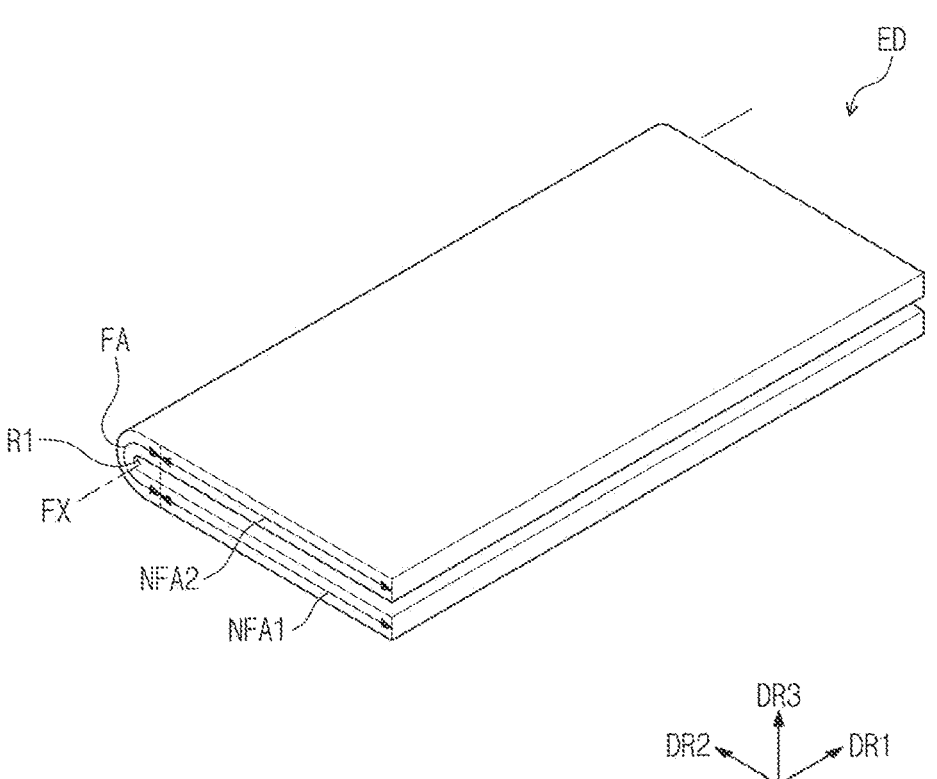
FIGS. 1B and 1C are perspective views illustrating a folded state of the electronic device illustrated in FIG. 1A.
Figure 1C:
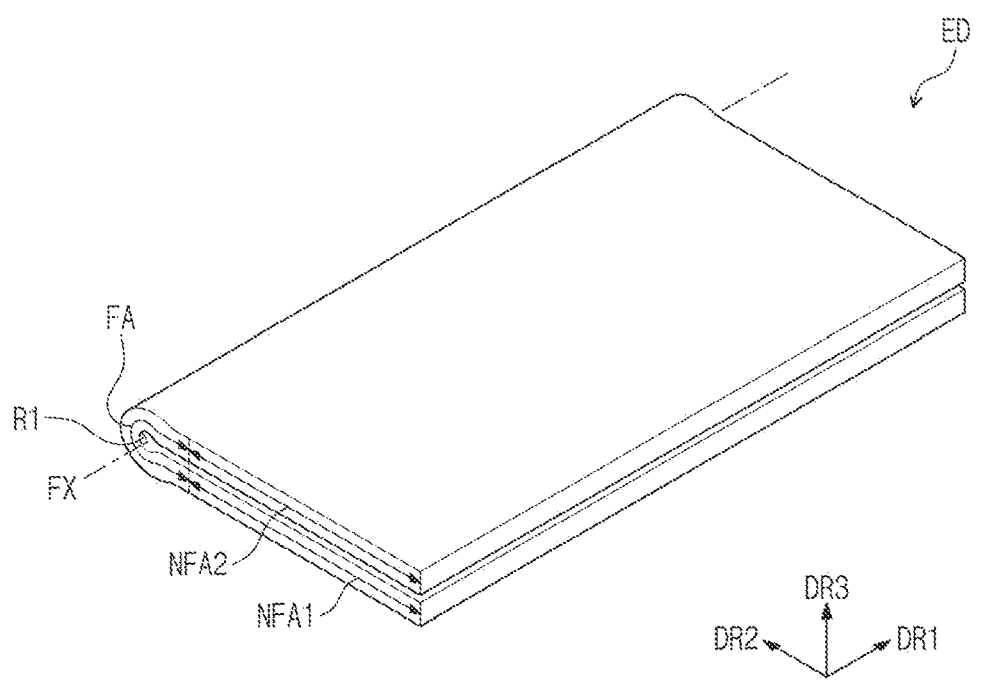

FIGS. 1A through 1C are perspective views of an electronic device according to one or more embodiments of the present disclosure. FIG. 1A illustrates an unfolded state, and FIGS. 1B and 1C illustrate a folded state.

Referring to FIGS. 1A to 1C, the electronic device ED according to an embodiment of the present disclosure may include a display surface DS defined by a first direction DR1 and a second direction DR2 crossing the first direction DR1. The electronic device ED may provide an image IM to a user through the display surface DS.

The display surface DS may include a display region DA, and a non-display region NDA around (e.g., adjacent to) the display region DA. The display region DA may display the image IM, and the non-display region NDA may not display the image IM. The non-display region NDA may surround (e.g., around a periphery of) the display region DA. However, the present disclosure is not limited thereto, and the shape of the display region DA and the shape of the non-display region NDA may be variously modified as needed or desired.

Hereinafter, a direction perpendicular to or substantially perpendicular to a plane defined by the first direction DR1 and the second direction DR2 may be referred to as a third direction DR3. The third direction DR3 may be a basis of a distinction between the front surfaces and the rear surfaces of various members. The expressions "from above a plane" and "in a plan view" as used herein may mean a view of a member in the third direction DR3. Hereinafter, the first to third directions DR1, DR2, and DR3 are directions indicated by the first to third directional axes shown in the figures, respectively, and are assigned with the same reference numerals as those of the first to third directional axes.

The electronic device ED may include a folding region FA, and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA2 in the second direction DR2. In the present embodiment, the foldable electronic device ED is illustrated as an example. However, the present disclosure is not limited thereto. The electronic device ED may be a bar-type electronic device, a rollable electronic device, or a slidable electronic device.

The electronic device ED may sense an input of a stylus pen STP, and an input by a body FG of the user. A finger is illustrated as an example of the user's body FG. The electronic device ED may sense the input of the stylus pen STP during a first mode period and the input of the user's body FG during a second mode period through time division driving.

As illustrated in FIG. 1B, the folding region FA may be folded about a folding axis FX parallel to or substantially parallel to the first direction DR1. The folding region FA has a desired curvature (e.g., a certain or predetermined curvature) and a radius of curvature R1. The electronic device ED may be folded in an in-folding manner, such that the first non-folding region NFA1 and the second non-folding region NFA2 face each other, and the display surface DS is not exposed to the outside.

In an embodiment of the present disclosure, the electronic device ED may be folded in an out-folding manner, such that the display surface DS is exposed to the outside. In an embodiment of the present disclosure, the electronic device ED may be configured such that an in-folding operation and an out-folding operation are repeatedly performed in an unfolded state. However, the present disclosure is not limited thereto. In an embodiment of the present disclosure, the electronic device ED may be configured to select one of an unfolding operation, an in-folding operation, and/or an out-folding operation.

As illustrated in FIG. 1B, the distance between the first non-folding region NFA1 and the second non-folding region NFA2 may be the same or substantially the same as twice the radius of curvature R1. However, the present disclosure is not limited thereto, and as illustrated in FIG. 1C, the distance between the first non-folding region NFA1 and the second non-folding region NFA2 may be smaller than twice the radius of curvature R1. FIGS. 1B and 1C are illustrated based on the display surface DS and housings HM (e.g., refer to FIG. 2) that form the exterior of the electronic device ED that may make contact with each other in distal end regions of the first non-folding region NFA1 and the second non-folding region NFA2.

Figure 2:
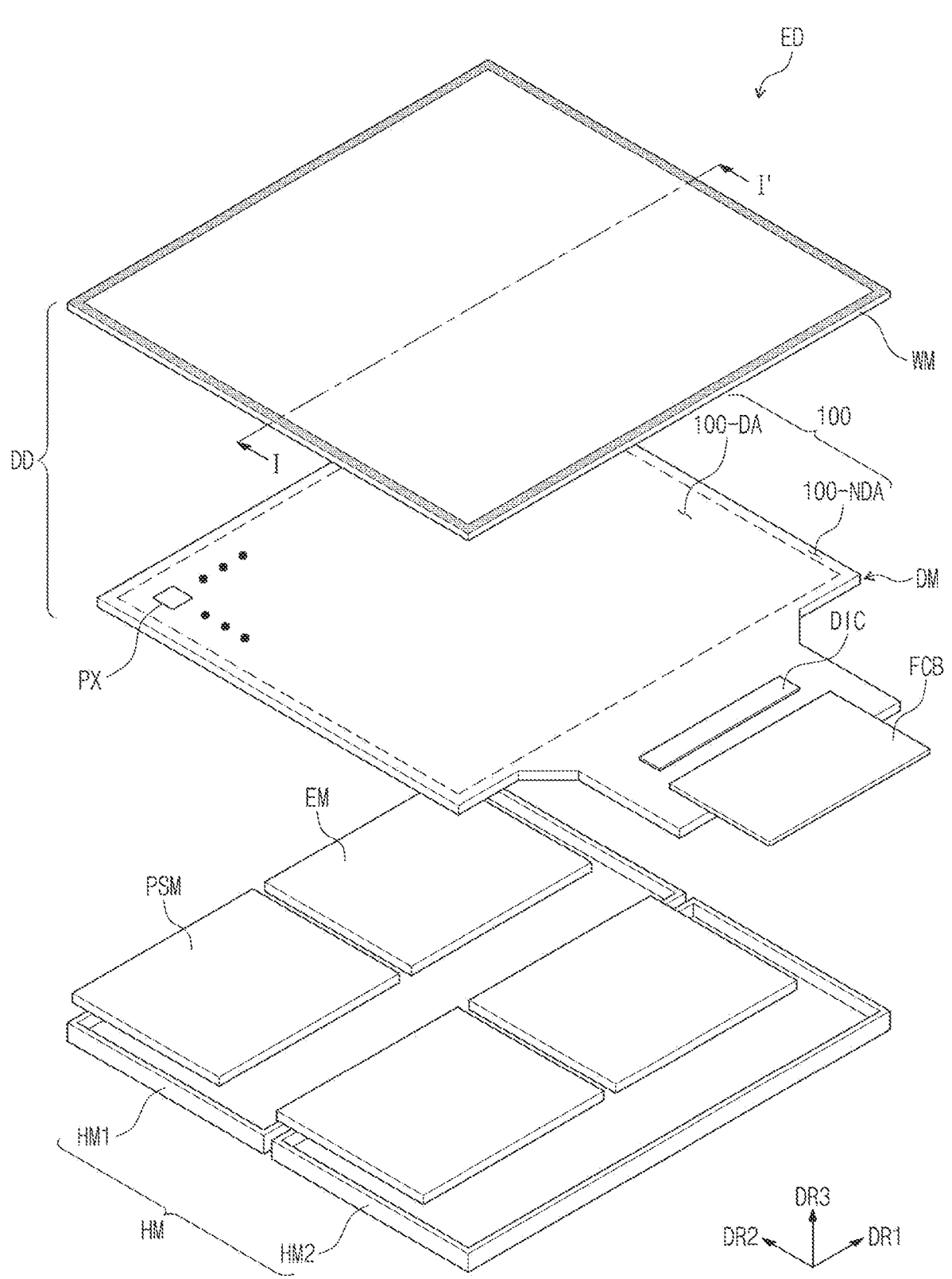
FIG. 2 is an exploded perspective view of the electronic device illustrated in FIG. 1A.

FIG. 2 is an exploded perspective view of the electronic device illustrated in FIG. 1A, according to an embodiment of the present disclosure.

Referring to FIG. 2, the electronic device ED may include a display device DD, electronic modules EM, power supply modules PSM, and the housings HM. The electronic device ED may further include a mechanical structure for controlling a folding operation of the display device DD. For convenience, in FIG. 2, adhesive layers that attach (e.g., couple) components to one another are not illustrated.

The display device DD generates an image and senses an external input. The display device DD includes a window WM and a display module DM. The window WM provides the front surface of the electronic device ED, and will be described in more detail below. The display device DD may further include additional components between the window WM and the display module DM, and/or may further include additional components under the display module DM.

The display module DM may include at least a display panel 100. The display module DM may further include a plurality of components disposed on the display panel 100. The display module DM will be described in more detail below.

The display panel 100 is not particularly limited, and may be, for example, an emissive display panel such as an organic light emitting display panel or an inorganic light emitting display panel.

The display panel 100 includes a display region 100-DA and a non-display region 100-NDA that correspond to the display region DA and the non-display region NDA of the electronic device ED (e.g., refer to FIG. 1A). Pixels PX are disposed in the display region 100-DA. The pixels PX may not be disposed in the non-display region 100-NDA, and signal lines for providing voltages to the pixels PX may be disposed in the non-display region 100-NDA. The expression "one region/portion corresponds to another region/portion" as used herein means that the regions/portions overlap with each other, and is not limited to having the same area as each other.

As illustrated in FIG. 2, a driver IC (integrated circuit) DIC may be disposed on the non-display region 100-NDA of the display panel 100. A flexible circuit film FCB may be connected to (e.g., attached to or coupled to) the non-display region 100-NDA of the display panel 100. The flexible circuit board FCB may be connected to a main circuit board. The main circuit board may be one of the electronic parts constituting the electronic modules EM. In addition, the electronic modules EM may further include a control module or controller (e.g., an application processor), a wireless communication module, and an image input module.

According to an embodiment, from among the electronic modules EM, a camera module (e.g., a camera) may be disposed under the display panel 100 to overlap with the display region 100-DA. The portion of the display region 100-DA that overlaps with the camera module may be a region having a higher light transmittance than that of a region adjacent thereto. The region having a relatively higher light transmittance may be defined as a region where a hole is formed through the display panel 100, or where at least some of the components included in the pixels PX are not deposited or patterned.

The driver IC DIC may include drive elements (e.g., a data drive circuit) for driving the pixels PX of the display panel 100. Although FIG. 2 illustrates a structure in which the driver IC DIC is mounted on the display panel 100, the present disclosure is not limited thereto. For example, the driver IC DIC may be mounted on the flexible circuit board FCB.

The electronic modules EM may be disposed in a first housing HM1 and a second housing HM2, respectively. The power supply modules PSM may be disposed in the first housing HM1 and the second housing HM2, respectively. In some embodiments, the electronic module EM disposed in the first housing HM1 and the electronic module EM disposed in the second housing HM2 may be electrically connected with each other through a flexible circuit board. The housings HM may be connected to (e.g., coupled with)

the display device DD, and more particularly, with the window WM, and may accommodate the other modules. Although the housings HM are illustrated as including the first and second housings HM1 and HM2 that are separated or spaced apart from each other, the present disclosure is not limited thereto. The electronic device ED may further include a hinge structure for connecting the first and second housings HM1 and HM2 to each other.

Figure 3:
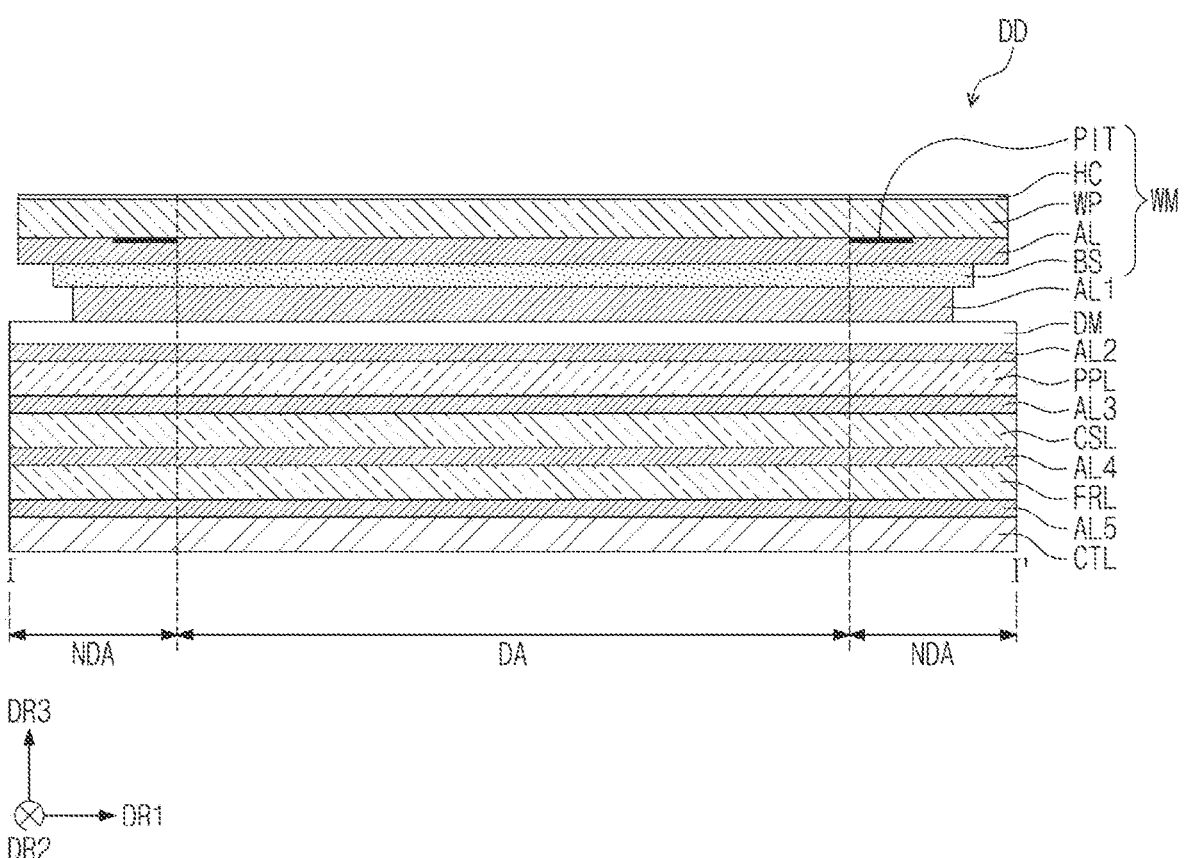
FIG. 3 is a sectional view of a display device corresponding to the line I-I' illustrated in FIG. 2.

FIG. 3 is a sectional view of the display device DD corresponding to the line I-I' illustrated in FIG. 2.

Referring to FIG. 3, the display device DD may include the window WM, the display module DM, a panel protection layer PPL, a cushion layer CSL, a ferrite layer FRL, a conductive layer CTL, and first to fifth adhesive layers AL1 to AL5. Each of the first to fifth adhesive layers AL1 to AL5 connects (e.g., attaches or couples) two components that are stacked adjacent to each other from among the components. The first to fifth adhesive layers AL1 to AL5 may include a pressure sensitive adhesive (PSA) or an optically clear adhesive (OCA). However, the kinds of adhesive layers are not limited thereto.

The window WM provides the outer surface of the display device DD. The window WM may include a base layer BS, a window protection layer WP, a hard coating layer HC, and a printed layer PIT (e.g., a black matrix layer). The base layer BS may have a property of being optically clear. The base layer BS may include glass or a synthetic resin film. The window protection layer WP is attached to the base layer BS through an adhesive layer AL. The window protection layer WP may include a flexible plastic material, such as polyimide or polyethylene terephthalate. The hard coating layer HC may be disposed on the upper surface of the window protection layer WP.

The printed layer PIT may be disposed on the lower surface of the window protection layer WP. The printed layer PIT may be a black matrix layer. The printed layer PIT may be black in color. However, the color of the printed layer PIT is not limited thereto. The printed layer PIT may be adjacent to the periphery of the window protection layer WP. The printed layer PIT may overlap with the non-display region NDA. However, the stacked structure of the window WM is not necessarily limited to the above-described structure.

The panel protection layer PPL may be disposed under the display module DM. The panel protection layer PPL may protect the bottom of the display module DM. The panel protection layer PPL may include a flexible plastic material. For example, the panel protection layer PPL may include polyethylene terephthalate (PET). In an embodiment of the present disclosure, the panel protection layer PPL may be omitted.

The cushion layer CSL is disposed under the panel protection layer PPL. The cushion layer CSL absorbs an external impact. The cushion layer CSL may include foamed plastic. In an embodiment of the present disclosure, the cushion layer CSL may be omitted.

The ferrite layer FRL may be disposed under the cushion layer CSL. The ferrite layer FRL may include a suitable material having a high transmittance. The ferrite layer FRL may include a ferromagnetic material. The ferrite layer FRL may include a magnetic metal powder layer. The magnetic metal powder layer may include a base resin, and magnetic metal powder mixed in the base resin. In an embodiment of the present disclosure, the ferrite layer FRL may be omitted.

The conductive layer CTL may be disposed under the ferrite layer FRL. The conductive layer CTL blocks electromagnetic waves that may be generated from the electronic modules EM illustrated in FIG. 2, such that the electromagnetic waves do not interfere with the display module DM (e.g., a noise shielding effect). The conductive layer CTL may include a diamagnetic material. In addition, the conductive layer CTL may radiate heat generated from the display module DM (e.g., a heat radiating effect), like the drive IC DIC (e.g., refer to FIG. 2).

The conductive layer CTL may include a metal layer, such as copper, aluminum, gold, or titanium. The conductive layer CTL may include a metal oxide layer, such as ITO or IZO. The conductive layer CTL may include carbon nanotubes, conductive polymer-coated carbon nanotubes, or graphite. In an embodiment of the present disclosure, the conductive layer CTL may be omitted.

Figure 4:
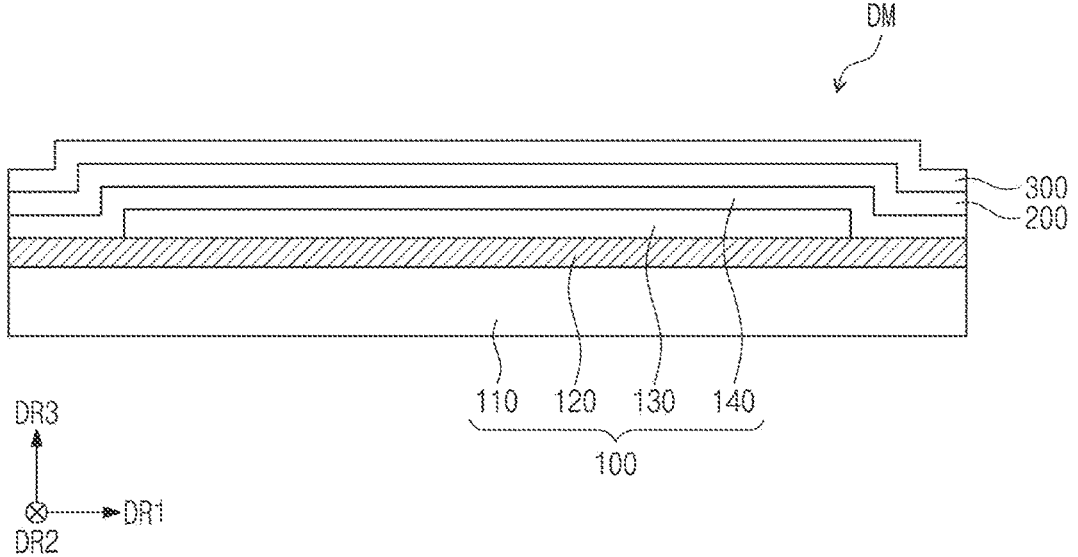
FIG. 4 is a sectional view of a display module according to an embodiment of the present disclosure.

FIG. 4 is a sectional view of the display module DM according to an embodiment of the present disclosure. Referring to FIG. 4, the display module DM may include the display panel 100, an input sensor 200, and an anti-reflector 300.

The display panel 100 may include a base layer 110, a driving element layer 120, a light emitting element layer 130, and an encapsulation layer 140. The base layer 110 may provide a base surface on which the driving element layer 120 is disposed. The base layer 110 may be a rigid substrate, or a flexible substrate that is able to be bent, folded, or rolled. The base layer 110 may be a glass substrate, a metal substrate, or a polymer substrate. However, the present disclosure is not limited thereto, and the base layer 110 may include an inorganic layer, an organic layer, or a composite layer.

The base layer 110 may have a multi-layered structure. For example, the base layer 110 may include a first synthetic resin layer, an inorganic layer having a multi-layered structure or a single-layer structure, and a second synthetic resin layer disposed on the inorganic layer having the multi-layered structure or the single-layer structure. Each of the first and second synthetic resin layers may include a polyimide-based resin, but is not particularly limited thereto.

The driving element layer 120 may be disposed on the base layer 110. The driving element layer 120 may include an insulating layer, a semiconductor pattern, a conductive pattern, and a signal line. The driving element layer 120 includes drive circuits of the pixels PX described above with reference to FIG. 2. The light emitting element layer 130 may be disposed on the driving element layer 120. The light emitting element layer 130 may include light emitting elements included in the respective pixels PX described above with reference to FIG. 2.

The encapsulation layer 140 may be disposed on the light emitting element layer 130. The encapsulation layer 140 may protect the light emitting element layer 130 from foreign matter, such as moisture, oxygen, and/or dust particles. The encapsulation layer 140 may include at least one inorganic layer. The encapsulation layer 140 may include a stacked structure of an inorganic layer/an organic layer/an inorganic layer.

The input sensor 200 may be disposed on the display panel 100. The input sensor 200 may sense the input of the stylus pen STP and the input by the user's body FG illustrated in FIG. 1A. The input sensor 200 may be formed on the display panel 100 through a continuous process. In this case, the input sensor 200 may be directly disposed on the display panel 100. As used herein, the expression "component A is directly disposed on component B" means that an adhesive layer is not disposed between component A and component B.

The anti-reflector 300 may be disposed on the input sensor 200. The anti-reflector 300 may decrease the reflectance of external light. The anti-reflector 300 may be directly disposed on the input sensor 200 through a continuous process.

The anti-reflector 300 may include color filters. The color filters have colors corresponding to the colors of source light. For example, a red color filter is disposed on a light emitting element that generates red light. The anti-reflector 300 may further include a light blocking pattern disposed between the color filters.

Figure 5:
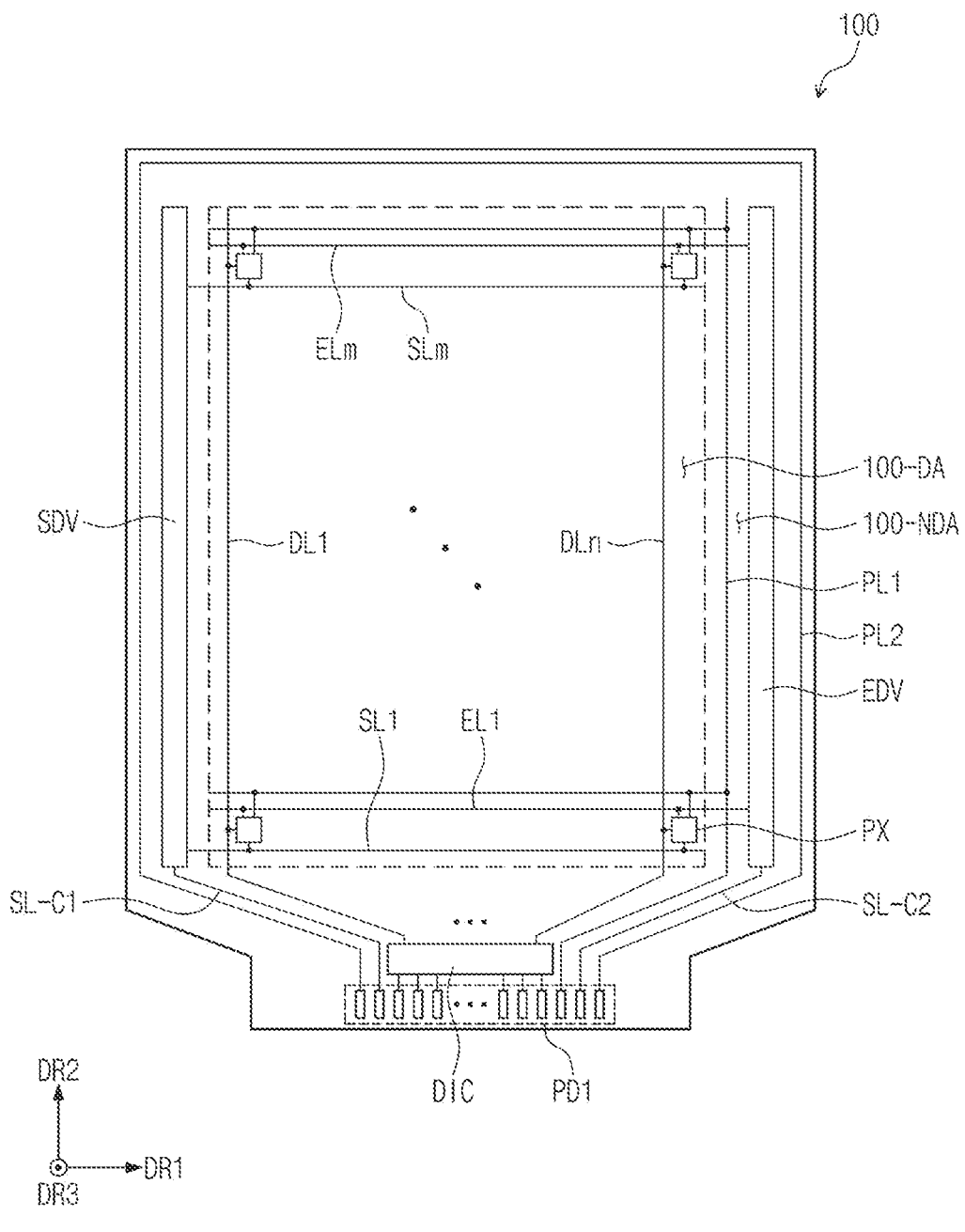
FIG. 5 is a plan view of a display panel according to an embodiment of the present disclosure.

FIG. 5 is a plan view of the display panel 100 according to an embodiment of the present disclosure.

Referring to FIG. 5, the display panel 100 may include the pixels PX, a scan drive circuit SDV, an emission drive circuit EDV, a plurality of signal lines, and a first pad part PD1 including a plurality of pads. The driver IC DIC mounted on the non-display region 100-NDA may include the data drive circuit. In an embodiment of the present disclosure, the data drive circuit may be integrated into the display panel 100, like the scan drive circuit SDV and the emission drive circuit EDV.

The plurality of signal lines may include a plurality of scan lines SL1 to SLm, a plurality of data lines DL1 to DLn, a plurality of emission lines EL1 to ELm, first and second control lines SL-C1 and SL-C2, and first and second power lines PL1 and PL2. Here, "m" and "n" are natural numbers of 2 or larger.

The scan lines SL1 to SLm may extend in the first direction DR1, and may be connected to the pixels PX and the scan drive circuit SDV. The data lines DL1 to DLn may extend in the second direction DR2, and may be connected to the pixels PX and the driver IC DIC. The emission lines EL1 to ELm may extend in the first direction DR1, and may be connected to the pixels PX and the emission drive circuit EDV.

The first power line PL1 receives a first power voltage, and the second power line PL2 receives a second power voltage having a lower level than that of the first power voltage. Second electrodes (e.g., cathodes) of the light emitting elements may be connected to the second power line PL2.

The first control line SL-C1 may be connected to the scan drive circuit SDV, and may extend toward a lower end of the display panel 100. The second control line SL-C2 may be connected to the emission drive circuit EDV, and may extend toward the lower end of the display panel 100. The first pad part PD1 may be disposed on the non-display region 100-NDA adjacent to the lower end of the display panel 100, and may be closer to the lower end of the display panel 100 than the driver IC DIC. The first pad part PD1 may be connected to the driver IC DIC and some of the signal lines. The scan drive circuit SDV may generate a plurality of scan signals, and the scan signals may be applied to the pixels PX through the scan lines SL1 to SLm. The driver IC DIC may generate a plurality of data voltages, and the data voltages may be applied to the pixels PX through the data lines DL1 to DLn. The emission drive circuit EDV may generate a plurality of emission signals, and the emission signals may be applied to the pixels PX through the emission lines EL1 to ELm.

The pixels PX may receive the data voltages in response to the scan signals. The pixels PX may display an image by emitting light having a luminance corresponding to the data voltages in response to the emission signals.

Figure 6:
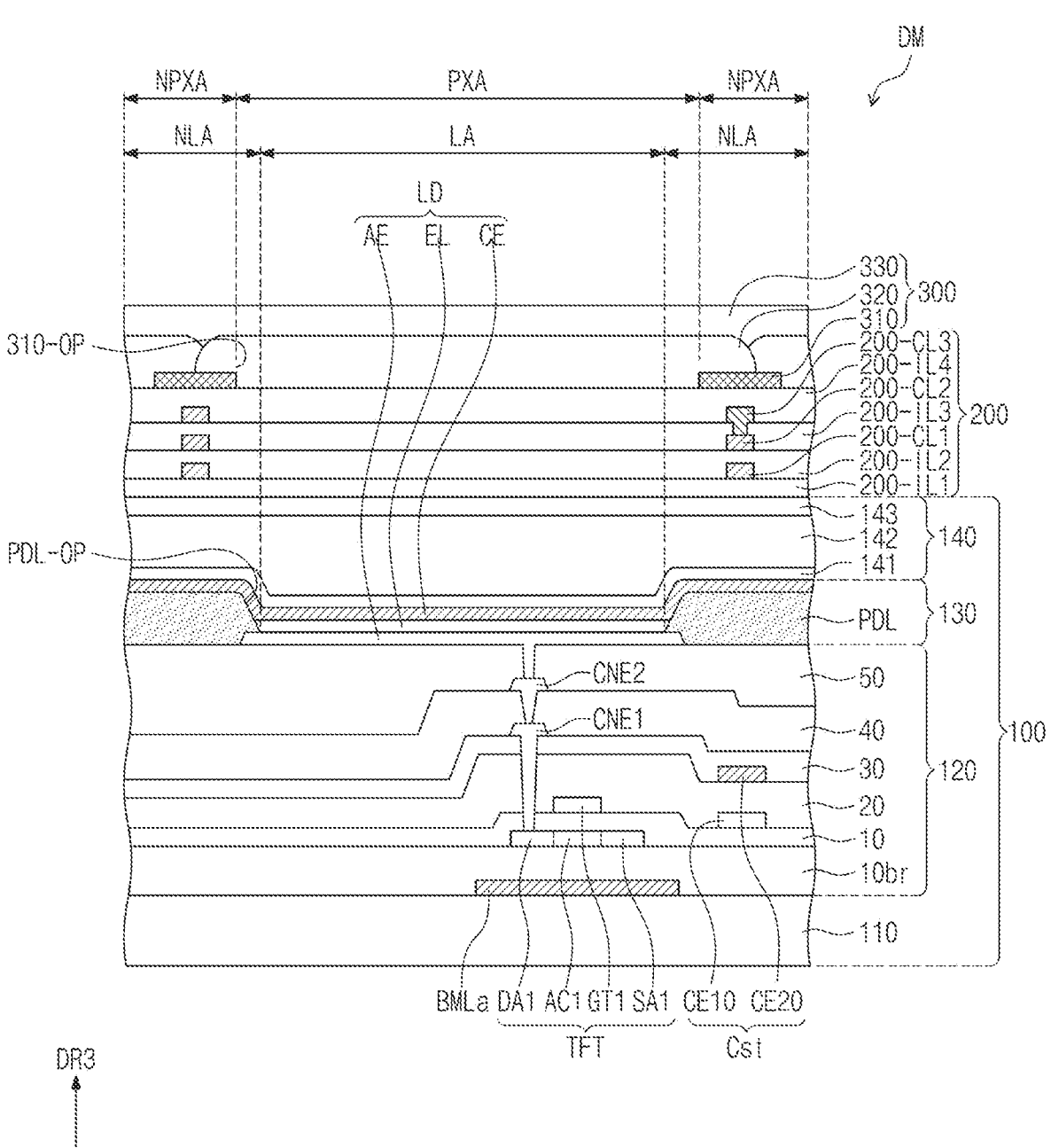
FIG. 6 is an enlarged sectional view of the display module according to an embodiment of the present disclosure.

FIG. 6 is an enlarged sectional view of the display module according to an embodiment of the present disclosure.

In FIG. 6, a section corresponding to one emissive region LA and one non-emissive region NLA is illustrated. The emissive region LA may be defined by an opening PDL-OP defined in a pixel defining layer PDL. In FIG. 6, a light emitting element LD and a transistor TFT included in one pixel PX are illustrated. The transistor TFT may be one of a plurality of transistors included in a drive circuit of the pixel PX. In the present embodiment, the transistor TFT is described in more detail in the context of a silicon transistor. However, the transistor TFT may be a metal oxide transistor.

A buffer layer 10*br* may be disposed on the base layer 110. The buffer layer 10*br* may prevent or substantially prevent diffusion of metal atoms or impurities from the base layer 110 to a semiconductor pattern on the upper side of the buffer layer 10*br*. The semiconductor pattern includes an active region AC1 of the transistor TFT.

A rear metal layer BMLa may be disposed under the transistor TFT. The rear metal layer BMLa may block external light from reaching the transistor TFT. The rear metal layer BMLa may be disposed between the base layer 110 and the buffer layer 10*br*. In an embodiment of the present disclosure, an inorganic barrier layer may be additionally disposed between the rear metal layer BMLa and the buffer layer 10*br*. The rear metal layer BMLa may be connected with an electrode or a line, and may receive a constant voltage or a signal from the electrode or the line.

The semiconductor pattern may be disposed on the buffer layer 10*br*. The semiconductor pattern may include a silicon semiconductor. For example, the silicon semiconductor may include amorphous silicon or polycrystalline silicon. For example, the semiconductor pattern may include low-temperature poly silicon.

The semiconductor pattern may include a first region having a high conductivity, and a second region having a low conductivity. The first region may be doped with an N-type dopant or a P-type dopant. A P-type transistor may include a doped region that is doped with a P-type dopant, and an N-type transistor may include a doped region that is doped with an N-type dopant. The second region may be an un-doped region, or may be a region more lightly doped than the first region.

The conductivity of the first region may be higher than the conductivity of the second region, and the first region may serve or substantially serve as an electrode or a signal line. The second region may correspond to or substantially correspond to the active region (e.g., channel) AC1 of the transistor TFT. In other words, one portion of the semiconductor pattern may be the active region AC1 of the transistor TFT, another portion may be a source or drain of the transistor TFT, and another portion may be a connecting electrode or a connecting signal line.

The source region (e.g., the source) SA1, the active region (e.g., the channel) AC1, and the drain region (e.g., the drain) DA1 of the transistor TFT may be formed from the semiconductor pattern. The source region SA1 and the drain region DA1 may extend from the active region AC1 in opposite directions from each other on the section (e.g., in a cross-sectional view).

A first insulating layer 10 may be disposed on the buffer layer 10*br*. The first insulating layer 10 may commonly overlap with the plurality of pixels PX (e.g., refer to FIG. 1), and may cover the semiconductor pattern. The first insulating layer 10 may include an inorganic layer and/or an organic layer, and may have a single-layer structure or a multi-layered structure. The inorganic layer may include at least one of aluminum oxide, titanium oxide, silicon oxide, silicon nitride, silicon oxy nitride, zirconium oxide, and/or hafnium oxide.

In the present embodiment, the first insulating layer 10 may be a single silicon oxide layer. However, not only the first insulating layer 10, but also the insulating layers of the driving element layer 120 described in more detail below, may be inorganic layers and/or organic layers, and may have a single-layer structure or a multi-layered structure. The inorganic layers may include at least one of the aforementioned materials, but the present disclosure is not limited thereto.

A gate GT1 of the transistor TFT is disposed on the first insulating layer 10. The gate GT1 may be a portion of a metal pattern. The gate GT1 overlaps with the active region AC1. The gate GT1 may function as a mask in a process of doping the semiconductor pattern. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), or indium zinc oxide (IZO), but the present disclosure is not particularly limited thereto.

A second insulating layer 20 may be disposed on the first insulating layer 10, and may cover the gate GT1. A third insulating layer 30 may be disposed on the second insulating layer 20. A second electrode CE20 of a storage capacitor Cst may be disposed between the second insulating layer 20 and the third insulating layer 30. Furthermore, a first electrode CE10 of the storage capacitor Cst may be disposed between the first insulating layer 10 and the second insulating layer 20.

A first connecting electrode CNE1 may be disposed on the third insulating layer 30. The first connecting electrode CNE1 may be connected to the drain region DA1 of the transistor TFT through a contact hole penetrating the first to third insulating layers 10, 20, and 30.

A fourth insulating layer 40 may be disposed on the third insulating layer 30. A second connecting electrode CNE2 may be disposed on the fourth insulating layer 40. The second connecting electrode CNE2 may be connected to the first connecting electrode CNE1 through a contact hole penetrating the fourth insulating layer 40. A fifth insulating layer 50 may be disposed on the fourth insulating layer 40, and may cover the second connecting electrode CNE2. The stacked structure of the first to fifth insulating layers 10, 20, 30, 40, and 50 is not limited thereto, and an additional conductive layer and/or an additional insulating layer may be further disposed in addition to the first to fifth insulating layers 10, 20, 30, 40, and 50.

The fourth insulating layer 40 and the fifth insulating layer 50 may be organic layers. For example, the organic layers may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vynyl alcohol-based polymer, or a suitable blend thereof.

The light emitting element LD may include a first electrode (e.g., a pixel electrode) AE, an emissive layer EL, and a second electrode (e.g., a common electrode) CE. The first electrode AE may be disposed on the fifth insulating layer 50. The first electrode AE may be a (semi-) transmissive electrode or a reflective electrode. The first electrode AE may include a reflective layer formed of Ag, Mg, Al, Pt, Pd, Au, Ni, Nd, Ir, Cr, or a suitable compound thereof, and a transparent or translucent electrode layer formed on the reflective layer. The transparent or translucent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For example, the first electrode AE may include a stacked structure of ITO/Ag/ITO.

The pixel defining layer PDL may be disposed on the fifth insulating layer 50. According to an embodiment, the pixel defining layer PDL may have a property of absorbing light. For example, the pixel defining layer PDL may be black in color. The pixel defining layer PDL may include a black coloring agent. The black coloring agent may include a black dye or a black pigment. The black coloring agent may include carbon black, a metal such as chromium, or an oxide thereof. The pixel defining layer PDL may correspond to a light blocking pattern having light blocking characteristics.

The pixel defining layer PDL may cover a portion of the first electrode AE (e.g., the anode). For example, the opening PDL-OP exposing the portion of the first electrode AE may be defined in the pixel defining layer PDL. As described above, the opening PDL-OP of the pixel defining layer PDL may define the emissive region LA.

The pixel defining layer PDL may increase the distance between the periphery of the first electrode AE and the second electrode CE (e.g., the cathode). Accordingly, the pixel defining layer PDL may serve to prevent or substantially prevent an arc from occurring at the periphery of the first electrode AE.

In some embodiments, a hole control layer may be disposed between the first electrode AE and the emissive layer EL. The hole control layer may include a hole transport layer, and may further include a hole injection layer. An electron control layer may be disposed between the emissive layer EL and the second electrode CE. The electron control layer may include an electron transport layer, and may further include an electron injection layer.

The encapsulation layer 140 may be disposed on the light emitting element layer 130. The encapsulation layer 140 may include an inorganic layer 141, an organic layer 142, and an inorganic layer 143 sequentially stacked one above another. However, the layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include a silicon nitride layer, a silicon oxy nitride layer, a silicon oxide layer, a titanium oxide layer, or an aluminum oxide layer. The organic layer 142 may include, but is not limited to, an acrylate-based organic layer.

The input sensor 200 may be disposed on the display panel 100. The input sensor 200 may include a first insulating layer 200-IL1, a first conductive pattern layer 200-CL1, a second insulating layer 200-IL2, a second conductive pattern layer 200-CL2, a third insulating layer 200-IL3, a third conductive pattern layer 200-CL3, and a fourth insulating layer 200-IL4 sequentially stacked one above another. The first insulating layer 200-IL1 may be directly disposed on the encapsulation layer 140.

In an embodiment of the present disclosure, one of the first to fourth insulating layers 200-IL1, 200-IL2, 200-IL3, and 200-IL4 may be omitted. When the first insulating layer 200-IL1 is omitted, the first conductive pattern layer 200-CL1 may be disposed on the uppermost insulating layer of the encapsulation layer 140. The fourth insulating layer 200-IL4 may be replaced with an adhesive layer or an insulating layer of the anti-reflector 300 disposed on the input sensor 200.

The first conductive pattern layer 200-CL1 may include first conductive patterns, the second conductive pattern layer 200-CL2 may include second conductive patterns, and the third conductive pattern layer 200-CL3 may include third conductive patterns.

The first conductive pattern layer 200-CL1 may be disposed on the first insulating layer 200-IL1, and may be covered by the second insulating layer 200-IL2.

The second conductive pattern layer 200-CL2 may be disposed on the second insulating layer 200-IL2, and may be covered by the third insulating layer 200-IL3. The third conductive pattern layer 200-CL3 may be disposed on the third insulating layer 200-IL3, and may be covered by the fourth insulating layer 200-IL4.

Each of the first to third conductive pattern layers 200-CL1, 200-CL2, and 200-CL3 may have a single-layer structure, or may have a multi-layered structure sequentially stacked in the third direction DR3. A conductive pattern layer having a multi-layered structure may include at least two of transparent conductive layers and metal layers. The multi-layered conductive layer may include metal layers containing different metals from each other. The transparent conductive layers may include indium tin oxide (ITO), indium zinc oxide (IZO), zinc oxide (ZnO), indium tin zinc oxide (ITZO), PEDOT, a metal nano-wire, or graphene. The metal layers may include molybdenum, silver, titanium, copper, aluminum, and/or a suitable alloy thereof.

Each of the first to third conductive pattern layers 200-CL1, 200-CL2, and 200-CL3 according to an embodiment may include first to third layers sequentially stacked one above another. The thicknesses of the first layer and the third layer may be less than the thickness of the second layer. According to an embodiment, each of the first layer and the third layer may include titanium (Ti), and the second layer may include aluminum (AI).

In the present embodiment, each of the first to fourth insulating layers 200-IL1, 200-IL2, 200-IL3, and 200-IL4 may include an inorganic layer or an organic layer. In the present embodiment, the first to third insulating layers 200-IL1, 200-IL2, and 200-IL3 may include inorganic layers, respectively. The inorganic layers may include silicon oxide, silicon nitride, or silicon oxy nitride.

In an embodiment of the present disclosure, at least one of the first to fourth insulating layers 200-IL1, 200-IL2, 200-IL3, and 200-IL4 may be an organic layer. For example, the fourth insulating layer 200-IL4 may include an organic layer. The organic layer may include at least one of an acrylic resin, a methacrylic resin, a polyisoprene resin, a vinyl resin, an epoxy resin, a urethane-based resin, a celluosic resin, a siloxane-based resin, a polyimide resin, a polyamide resin, and/or a perylene-based resin.

According to an embodiment, when a camera module (e.g., a camera) is disposed under the display panel 100 as described above with reference to FIG. 5 to overlap with the display region 100-DA, the input sensor 200 may further include an interlayer insulating layer. The interlayer insulating layer may be disposed between the first insulating layer 200-IL1 and the second insulating layer 200-IL2. The interlayer insulating layer may be an organic layer. The interlayer insulating layer may compensate for a step generated in a process of forming a hole in the region of the display panel 100 (e.g., refer to FIG. 5) that is adjacent to the camera module.

The anti-reflector 300 may be disposed on the input sensor 200. The anti-reflector 300 may include a light blocking pattern 310, a color filter 320, and a planarization layer 330. In an embodiment of the present disclosure, the light blocking pattern 310 may be omitted.

A material constituting the light blocking pattern 310 is not particularly limited, as long as it is a material capable of absorbing light. The light blocking pattern 310, which is a layer having a black color, may include a black coloring agent in an embodiment. The black coloring agent may include a black dye or a black pigment. The black coloring agent may include carbon black, a metal such as chromium, or an oxide thereof.

The light blocking pattern 310 may overlap with the third conductive pattern layer 200-CL3 when viewed from above the plane (e.g., in a plan view). The light blocking pattern 310 may prevent or substantially prevent a reflection of external light by the first to third conductive pattern layers 200-CL1, 200-CL2, and 200-CL3. The light blocking pattern 310 may have an opening 310-OP defined therein. The opening 310-OP of the light blocking pattern 310 may overlap with the first electrode AE, and may have a larger area than that of the opening PDL-OP of the pixel defining layer PDL. The opening 310-OP of the light blocking pattern 310 may be defined as a pixel region PXA. The pixel region PXA may be defined as a region through which light generated from the light emitting element LD and passing through the opening PDL-OP of the pixel defining layer PDL is emitted to the outside. As the area of the pixel region PXA is increased, the luminance of an image may be increased.

The color filter 320 may overlap with at least the pixel region PXA. The color filter 320 may further overlap with a non-pixel region NPXA. A portion of the color filter 320 may be disposed on the light blocking pattern 310. The color filter 320 may transmit light generated from the light emitting element LD, and may block some wavelength bands of external light. Accordingly, the color filter 320 may decrease a reflection of external light by the first electrode AE or the second electrode CE.

The planarization layer 330 may cover the light blocking pattern 310 and the color filter 320. The planarization layer 330 may include an organic material. The planarization layer 330 may provide a flat or substantially flat upper surface.

Figure 7A:
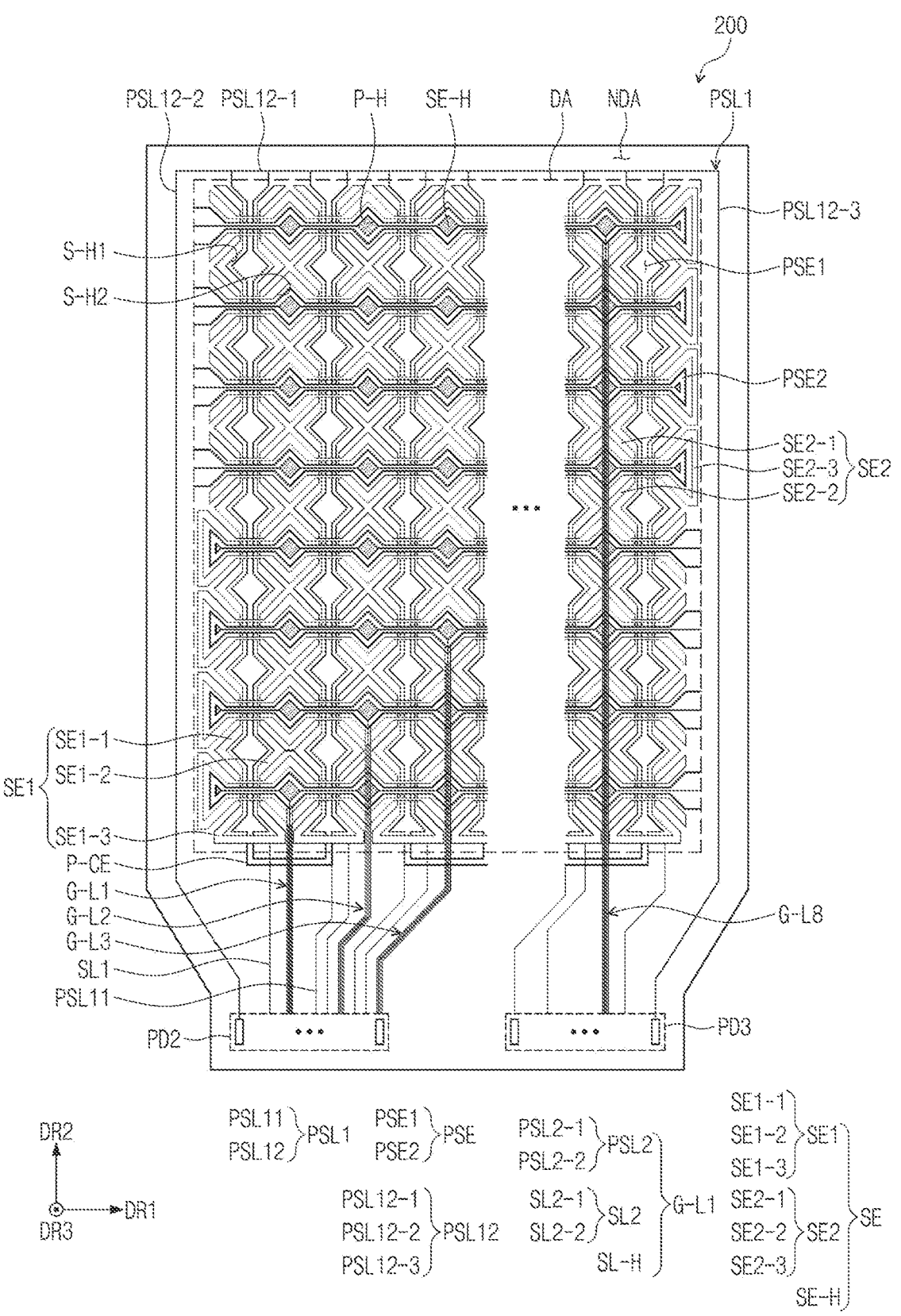
FIG. 7A is a plan view of an input sensor according to an embodiment of the present disclosure.
Figure 7B:
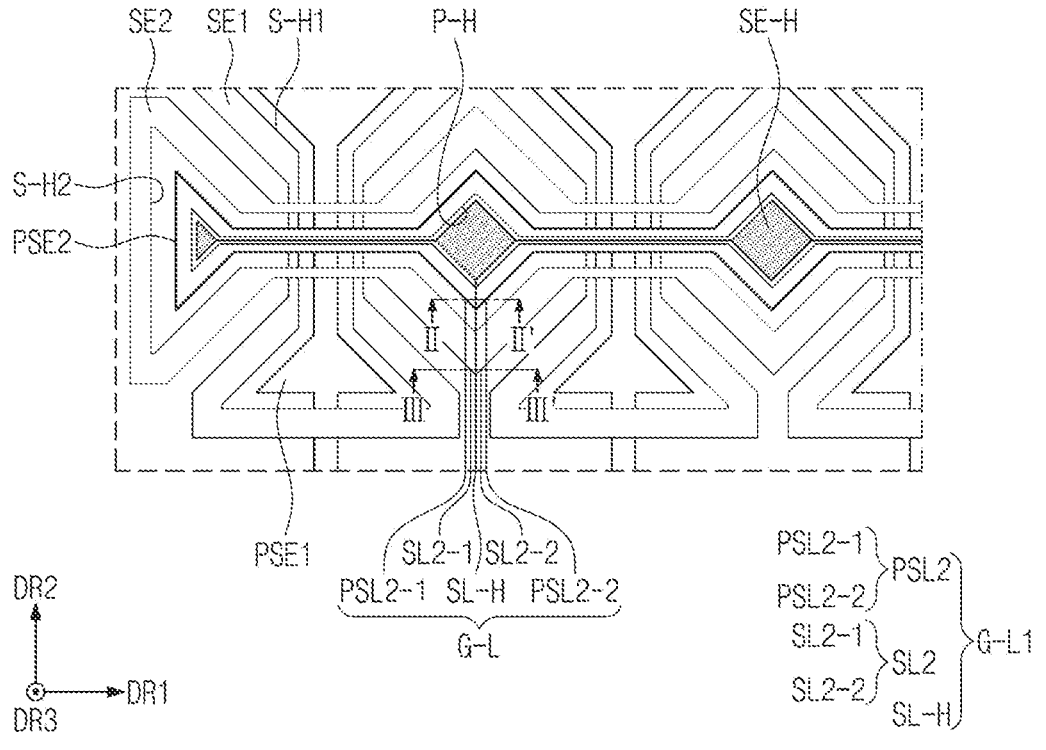
FIG. 7B is an enlarged plan view of a partial region of the input sensor according to an embodiment of the present disclosure.
Figure 8A:
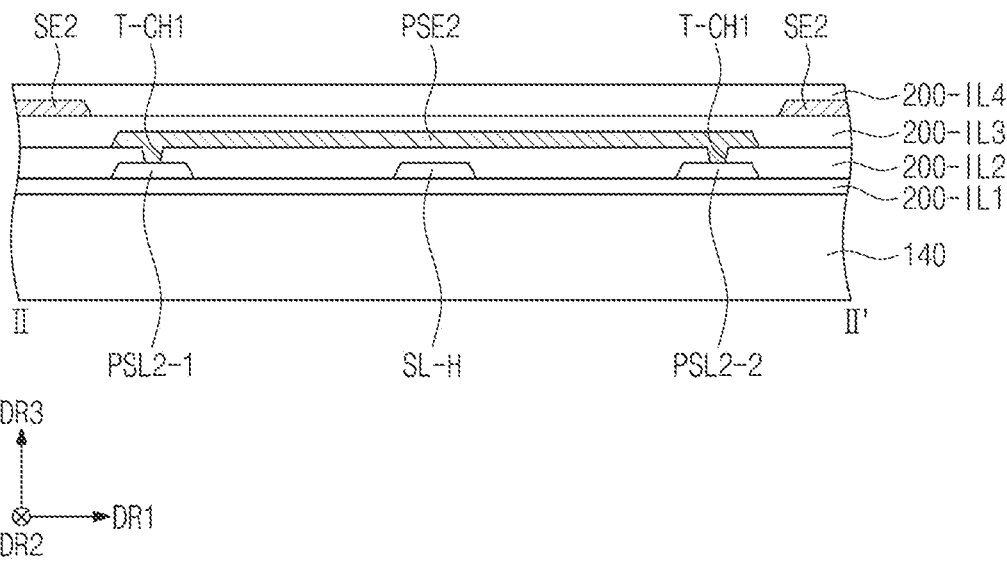
FIG. 8A is a sectional view of the input sensor corresponding to the line II-II' illustrated in FIG. 7B.
Figure 8B:
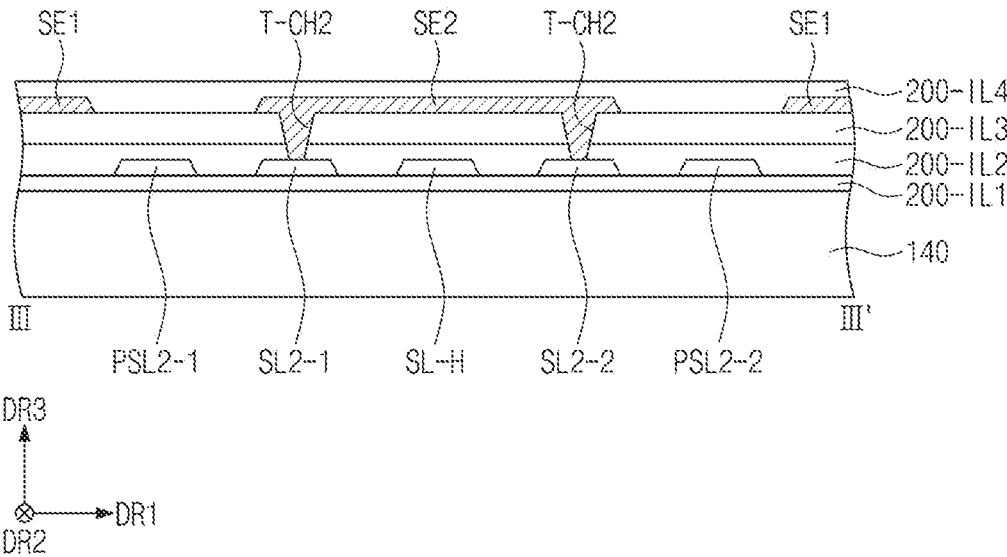
FIG. 8B is a sectional view of the input sensor corresponding to the line III-III' illustrated in FIG. 7B.

FIG. 7A is a plan view of the input sensor according to an embodiment of the present disclosure. FIG. 7B is an enlarged plan view of a partial region of the input sensor according to an embodiment of the present disclosure. FIG. 8A is a sectional view of the input sensor corresponding to the line II-II' illustrated in FIG. 7B. FIG. 8B is a sectional view of the input sensor corresponding to the line III-III' illustrated in FIG. 7B.

Referring to FIG. 7A, the input sensor 200 according to an embodiment of the present disclosure may sense a first input using an electromagnetic induction method, and may sense a second input using a capacitance method. The first input may be an input by the stylus pen STP described above with reference to FIG. 1A. The second input may be an input by the user's body (e.g., the user's finger) FG described above with reference to FIG. 1A. In other words, the first input may be an input that provides a magnetic field signal, and the second input may be an input capable of causing a change in a capacitance.

The input sensor 200 may sense the first input and the second input through time division driving. A period in which the input sensor 200 operates in a first mode to sense the first input may be defined as a first operation period, and a period in which the input sensor 200 operates in a second mode to sense the second input may be defined as a second operation period.

The input sensor 200 may be switched between the first mode and the second mode through selection by the user. As another example, one of the first mode or the second mode may be activated, or the input sensor 200 may be switched between the first mode and the second mode, by activation of an application (e.g., a specific application). The input sensor 200 may be maintained in the first mode when the first input is sensed while the input sensor 200 alternately operates in the first mode and the second mode, or may be maintained in the second mode when the second input is sensed while the input sensor 200 alternately operates in the first mode and the second mode.

The input sensor 200 may include a first sensor layer that senses the first input using an electromagnetic induction method, and a second sensor layer that senses the second input using a capacitance method. The second sensor layer may be disposed on the first sensor layer, or the first sensor layer may be disposed on the second sensor layer. The present disclosure is not limited to any particular embodiment.

In the input sensor 200, the first sensor layer may include first group electrodes PSE, and the second sensor layer may include second group electrodes SE.

The first group electrodes PSE may include electrodes 1-1 (e.g., first-first electrodes) PSE1 and electrodes 1-2 (e.g., first-second electrodes) PSE2. The electrodes 1-1 PSE1 may be arranged along the first direction DR1, and each of the electrodes 1-1 PSE1 may extend in the second direction DR2.

The electrodes 1-2 PSE2 may be insulated from the electrodes 1-1 PSE1, and may cross the electrodes 1-1 PSE1. The electrodes 1-2 PSE2 may be arranged along the second direction DR2, and each of the electrodes 1-2 PSE2 may extend in the first direction DR1.

From among the electrodes 1-2 PSE2, the electrodes 1-2 PSE2 that are disposed on the upper side may have an open loop shape that is open at the left side, and the electrodes 1-2 PSE2 disposed on the lower side may have an open loop shape that is open at the right side. Electrodes 2-3 (e.g., second-third electrodes) SE-H may overlap with recesses P-H defined in the electrodes 1-2 PSE2. According to the present embodiment, two electrodes 1-1 PSE1 that are adjacent to each other in the first direction DR1 may be connected with each other by a connecting portion P-CE.

A resonance circuit of the stylus pen STP (e.g., refer to FIG. 1A) may be charged through at least one of the electrodes 1-1 PSE1 and/or the electrodes 1-2 PSE2, and a magnetic field signal output from the stylus pen STP is sensed through the electrodes 1-1 PSE1 and the electrodes 1-2 PSE2. A drive circuit of the input sensor 200 provides a drive signal to at least one of the electrodes 1-1 PSE1 and/or the electrodes 1-2 PSE2, and a sensing circuit of the input sensor 200 senses an electromagnetically induced current formed in the electrodes 1-1 PSE1 and the electrodes 1-2 PSE2.

The second group electrodes SE may include electrodes 2-1 (e.g., second-first electrodes) SE1 and electrodes 2-2 (e.g., second-second electrodes) SE2. The electrodes 2-1 SE1 may be arranged along the first direction DR1, and each of the electrodes 2-1 SE1 may extend in the second direction DR2. The electrodes 2-2 SE2 may be insulated from the electrodes 2-1 SE1, and may cross the electrodes 2-1 SE1. The electrodes 2-2 SE2 may be arranged along the second direction DR2, and each of the electrodes 2-2 SE2 may extend in the first direction DR1. The electrodes 2-1 SE1 and the electrodes 2-2 SE2 are capacitively coupled to each other. First recesses S-H1 overlapping with the electrodes 1-1 PSE1 when viewed from above the plane (e.g., in a plan view) may be defined in the electrodes 2-1 SE1, and second recesses S-H2 overlapping with the electrodes 1-2 PSE2 when viewed from above the plane (e.g., in a plan view) may be defined in the electrodes 2-2 SE2.

Each of the electrodes 2-1 SE1 may include extending portions 1-1 (e.g., first-first extending portions) SE1-1 and extending portions 1-2 (e.g., first-second extending portions) SE1-2 that have the shapes of inequality signs in different directions from each other, and that are spaced apart from each other in the first direction DR1. The extending portions 1-1 SE1-1 may be arranged along the second direction DR2, and the extending portions 1-2 SE1-2 may be arranged along the second direction DR2.

The extending portions 1-1 SE1-1 and the extending portions 1-2 SE1-2 facing each other in the first direction DR1 may have shapes that are symmetrical to or substantially symmetrical to each other with respect to the second direction DR2 (e.g., horizontally symmetrical to each other). The extending portions 1-1 SE1-1 may have the shape of a less than sign ("<"), and the extending portions 1-2 SE1-2 may have the shape of a greater than sign (">").

Each of the electrodes 2-2 SE2 may include extending portions 2-1 (e.g., second-first extending portions) SE2-1 and extending portions 2-2 (e.g., second-second extending portions) SE2-2 that have the shapes of tilted inequality signs in different directions from each other, and that are spaced apart from each other in the second direction DR2. The extending portions 2-1 SE2-1 may be arranged along the first direction DR1, and the extending portions 2-2 SE2-2 may be arranged along the first direction DR1.

The extending portions 2-1 SE2-1 and the extending portions 2-2 SE2-2 facing each other in the second direction DR2 may have shapes that are symmetrical to or substantially symmetrical to each other with respect to the first direction DR1 (e.g., vertically symmetrical to each other). The extending portions 2-1 SE2-1 may have the shape of an upside-down V ("∧"), and the extending portions 2-2 SE2-2 may have the shape of a V ("∨").

Each of the electrodes 2-2 SE2 may further include a second intermediate portion SE2-3. The second intermediate portion SE2-3 may extend in the second direction DR2. The second intermediate portion SE2-3 is disposed between one end of the extending portion 2-1 SE2-1 and one end of the extending portion 2-2 SE2-2.

The second intermediate portions SE2-3 of the electrodes 2-2 SE2 disposed in the upper region may be disposed on the right side, and may not be disposed on the left side. The second intermediate portions SE2-3 of the electrodes 2-2 SE2 disposed in the lower region may be disposed on the left side. Accordingly, one electrode 2-2 SE2 may have a loop shape that is open at either one side or an opposite side.

Each of the electrodes 2-1 SE1 may further include a first intermediate portion SE1-3. The first intermediate portion SE1-3 may be disposed adjacent to pad parts PD2 and PD3. The first intermediate portion SE1-3 may connect the extending portion 1-1 SE1-1 and the extending portion 1-2 SE1-2 of the electrode 2-1 SE1 to each other. The first intermediate portion SE1-3 may not be disposed in the upper region. Accordingly, one electrode 2-1 SE1 may have an open loop shape that is open at an opposite side. According to an embodiment, a signal line (e.g., a second-first signal line) 2-1 SL1 may be connected to the first intermediate portion SE1-3.

According to an embodiment, the first intermediate portion SE1-3 may be insulated from the electrode 1-1 PSE1, and may cross the electrode 1-1 PSE1. In the region where the first intermediate portion SE1-3 and the electrode 1-1 PSE1 cross each other, a bridge may be disposed in a region where different conductive patterns cross each other. The bridge may constitute a portion of the first conductive pattern. The remaining portion of the first conductive pattern and the second conductive pattern may be disposed at (e.g., in or on) a layer different from that of the bridge.

The second sensor layer of the input sensor 200 according to an embodiment of the present disclosure may further include the electrodes 2-3 (e.g., the second-third electrodes) SE-H. The electrodes 2-3 SE-H may be disposed in the recesses P-H defined in the electrodes 1-2 PSE2, respectively. The electrodes 2-3 SE-H may remove noise generated when the input sensor 200 senses the second input using a capacitance method. For example, the noise generated when the input sensor 200 senses the second input using the capacitance method may be removed by calculating a difference between a change in capacitance formed between the electrode 2-1 SE1 and the adjacent electrode 2-2 SE2, and a change in capacitance formed between the electrode 2-1 SE1 and the adjacent electrode 2-3 SE-H. According to one or more embodiments of the present disclosure, because the second sensor layer of the input sensor 200 includes the electrodes 2-3 SE-H capable of removing noise when the input sensor 200 senses an external input by the user's body FG (e.g., refer to FIG. 1A), the sensing sensitivity of the input sensor 200 may be improved.

The drive circuit of the input sensor 200 provides the drive signal to one of the electrodes 2-1 SE1 and/or the electrodes 2-2 SE2, and the sensing circuit of the input sensor 200 measures, through the other one of the electrodes 2-1 SE1 and/or the electrodes 2-2 SE2, a difference between the capacitance of a mutual capacitor formed between the electrode 2-1 SE1 and the electrode 2-2 SE2, and the capacitance of a mutual capacitor formed between the electrode 2-1 SE1 and the electrode 2-3 SE-H.

After the above-described operation is executed during a first period of the second operation period, the above-described operation may be executed in reverse during a second period of the second operation period. The first period and the second period may be repeated as one set.

The input sensor 200 may include the second pad part PD2 and the third pad part PD3, each of which includes a plurality of pads. The second pad part PD2 and the third pad part PD3 may be spaced apart from each other in the first direction DR1, with the first pad part PD1 (e.g., see FIG. 5) therebetween.

Signal lines included in the input sensor 200 may be connected to the pads included in the pad parts PD2 and PD3. The second pad part PD2 and the third pad part PD3 may be adjacent to the lower end of the input sensor 200 when viewed from above the plane (e.g., in a plan view).

The input sensor 200 may include first signal lines connected to the first group electrodes PSE, and second signal lines connected to the second group electrodes SE.

The first signal lines may include signal lines 1-1 (e.g., first-first signal lines) PSL1 connected to the electrodes 1-1 PSE1, and signal lines 1-2 (e.g., first-second signal lines) PSL2 connected to ends of the electrodes 1-2 PSE2. The second signal lines may include signal lines 2-1 (e.g., second-first signal lines) SL1 connected to the electrodes 2-1 SE1, and signal lines 2-2 (e.g., second-second signal lines) SL2 connected to the electrodes 2-2 SE2.

According to one or more embodiments of the present disclosure, at least some of the first signal lines and/or the second signal lines may overlap with the display region DA. The remaining first and second signal lines may be disposed in the non-display region NDA, and may be connected to corresponding electrodes.

The signal lines 1-1 PSL1 may be disposed in the non-display region NDA. The signal lines 1-1 PSL1 may include lines 1-1 (e.g., first-first lines) PSL11 connected to first ends of the electrodes 1-1 PSE1, and a line 1-2 (e.g., a first-second line) PSL12 connected to second ends of the electrodes 1-1 PSE1.

One line 1-1 PSL11 is connected to two electrodes 1-1 PSE1 that are adjacent to each other in the first direction DR1. For example, the one line 1-1 PSL11 may be connected to a corresponding connecting portion P-CE.

In the upper region, the second ends of the electrodes 1-1 PSE1 may be connected together through the line 1-2 PSL12. One end of the line 1-2 PSL12 may be connected to a pad of the second pad part PD2, and an opposite end of the line 1-2 PSL12 may be connected to a pad of the third pad part PD3. For example, the line 1-2 PSL12 may include a first portion PSL12-1, a second portion PSL12-2, and a third portion PSL12-3. The first portion PSL12-1 may extend in the first direction DR1, and may be connected to the second ends of the electrodes 1-1 PSE1 disposed in the upper region. The second portion PSL12-2 may be bent from the first portion PSL12-1, and may be connected to the second pad part PD2. The third portion PSL12-3 may be bent from the first portion PSL12-1, and may be connected to the third pad part PD3.

The signal lines 2-1 SL1 may be disposed in the non-display region NDA. The signal lines 2-1 SL1 may be connected to the first intermediate portions SE1-3 of the corresponding electrodes 2-1 SE1. The signal lines 2-1 SL1 connected to the electrodes 2-1 SE1 disposed on the left side with respect to the center of the display region DA in the first direction DR1 may be connected to the pads of the second pad part PD2. The signal lines 2-1 SL1 connected to the electrodes 2-1 SE1 disposed on the right side with respect to the center of the display region DA in the first direction DR1 may be connected to the pads of the third pad part PD3.

According to one or more embodiments of the present disclosure, at least some of the first signal lines and/or the second signal lines may overlap with the display region DA. For example, at least some of the signal lines 1-2 PSL2 connected to the electrodes 1-2 PSE2, at least some of the signal lines 2-2 SL2 connected to the electrodes 2-2 SE2, and at least some of the signal lines 2-3 SL-H connected to the electrodes 2-3 SE-H may be disposed in the display region DA, and the others may be disposed in the non-display region NDA.

From among the first signal lines and the second signal lines, the signal lines at least partially overlapping with the display region DA may be grouped and defined as a "line group". The input sensor 200 may include eight line groups G-L1 to G-L8. The number of line groups G-L1 to G-L8 may be variously modified to correspond to the number of row electrodes extending in the first direction DR1. According to an embodiment, the input sensor 200 may include eight row electrodes. One row electrode may include an electrode 2-2 (e.g., a second-second electrode) SE2, an electrode 1-2 (e.g., a first-second electrode) PSE2 disposed inside the electrode 2-2 SE2, and an electrode 2-3 (e.g., a second-third electrode) SE-H disposed inside the electrode 1-2 PSE2.

The first line group G-L1 may be connected to the first row electrode adjacent to the pad parts PD2 and PD3. The second line group G-L2 may be connected to the second row electrode spaced apart from the first row electrode in the second direction DR2. The eighth line group G-L8 may be connected to the eighth row electrode in a similar way. Accordingly, the widths of the signal lines in the second direction DR2 may be increased from the first line group G-L1 toward the eighth line group G-L8. Hereinafter, the signal lines included in the first line group G-L1 will be described in more detail, and redundant description of the second to eighth line groups G-L2 to G-L8 may not be repeated.

Referring to FIG. 7B, the first line group G-L1 may include a signal line 1-2 PSL2 (e.g., a signal line 1-1 or a first-first signal line in the claims) connected to the electrode 1-2 PSE2 included in the first row electrode, a signal line 2-2 SL2 (e.g., some of signal lines 2-1 or second-first signal lines in the claims) connected to the electrode 2-2 SE2, and a signal line 2-3 SL-H (e.g., other signal lines 2-1 or second-first signal lines in the claims) connected to the electrode 2-3 SE-H.

The signal line 1-2 PSL2 may include a first left line PSL2-1 and a first right line PSL2-2. The first left line PSL2-1 and the first right line PSL2-2 may be spaced apart from each other in the first direction DR1 in the display region DA.

One end of the first left line PSL2-1 and one end of the first right line PSL2-2 may be connected to the electrode 1-2 PSE2, and an opposite end of the first left line PSL2-1 and an opposite end of the first right line PSL2-2 may be connected to pads of the second pad part PD2 to transmit/receive the same signal as each other, or may be connected to one line in the non-display region NDA and may be connected to one pad.

The signal line 2-2 SL2 may include a second left line SL2-1 and a second right line SL2-2. The second left line SL2-1 and the second right line SL2-2 may be spaced apart from each other in the first direction DR1 in the display region DA.

One end of the second left line SL2-1 and one end of the second right line SL2-2 may be connected to the extending portion 2-2 SE2-2, and an opposite end of the second left line SL2-1 and an opposite end of the second right line SL2-2 may be connected to pads of the second pad part PD2 to transmit/receive the same signal as each other, or may be connected to one line in the non-display region NDA and may be connected to one pad.

The signal line 2-3 SL-H (e.g., a central line in the claims) may be disposed between the second left line SL2-1 and the second right line SL2-2. The signal line 2-3 SL-H may be connected to the electrode 2-3 SE-H.

In FIGS. 8A and 8B, a connection relationship and a layer structure of the lines included in the first line group G-L1 and the electrodes included in the first row electrode are illustrated in more detail.

Referring to FIGS. 8A and 8B, portions of the electrodes 1-1 PSE1 and the electrodes 1-2 PSE2 included in the first group electrodes PSE (e.g., refer to FIG. 7A) may be disposed on the second insulating layer 200-IL2. The remaining portions of the electrodes 1-1 PSE1 may be disposed on the first insulating layer 200-IL1 as bridge patterns described in more detail below.

Portions of the electrodes 2-1 SE1 and the electrodes 2-2 SE2 included in the second group electrodes SE (e.g., refer to FIG. 7A) may be disposed on the third insulating layer 200-IL3. The remaining portions of the electrodes 2-1 SE1 may be disposed on the first insulating layer 200-IL1 as bridge patterns described in more detail below.

The signal line 1-2 PSL2, the signal line 2-2 SL2, and the signal line 2-3 SL-H (e.g., the central line) included in the first line group G-L1 may be disposed on the first insulating layer 200-IL1.

Referring to FIG. 8A, the electrode 1-2 PSE2 may be disposed in contact holes T-CH1 defined in the second insulating layer 200-IL2, and may be connected to the first left line PSL2-1 and the first right line PSL2-2.

Referring to FIG. 8B, the electrode 2-2 SE2 may be disposed in contact holes T-CH2 defined in the second insulating layer 200-IL2 and the third insulating layer 200-IL3, and may be connected to the second left line SL2-1 and the second right line SL2-2.

In the input sensor 200 according to one or more embodiments of the present disclosure, the lines included in the first line group G-L1 overlapping with the display region DA and the electrodes included in the first row electrode may be disposed at (e.g., in or on) different layers from each other. Accordingly, even though the number of electrodes disposed in the display region DA of the input sensor 200 may be increased, a dead space for disposing the lines included in the first line group G-L1 in the non-display region NDA may be reduced. Thus, the input sensor 200 having the decreased non-display region NDA may be provided.

Figure 9:
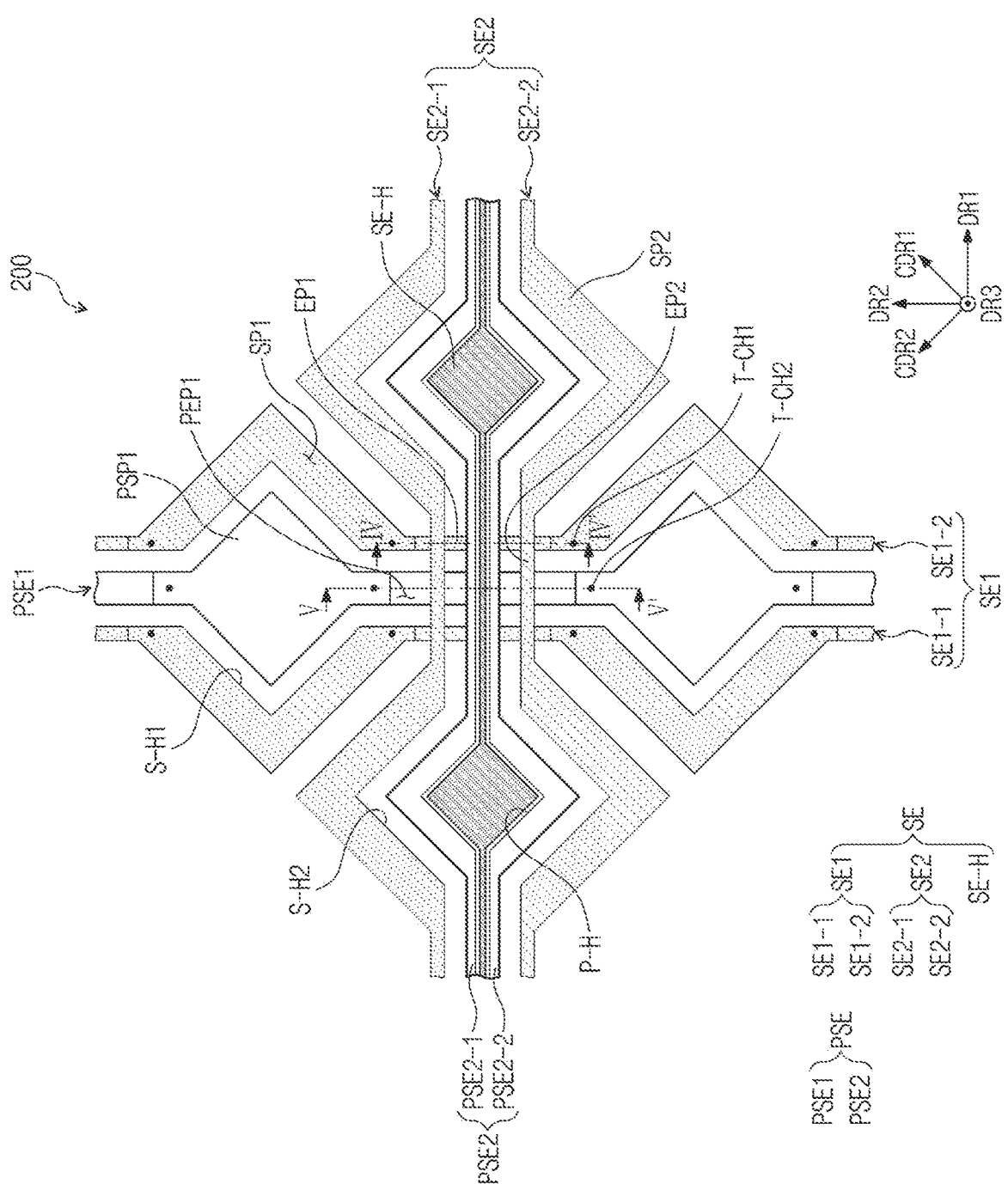
FIG. 9 is an enlarged plan view of a partial region of the input sensor according to an embodiment of the present disclosure.
Figure 10A:
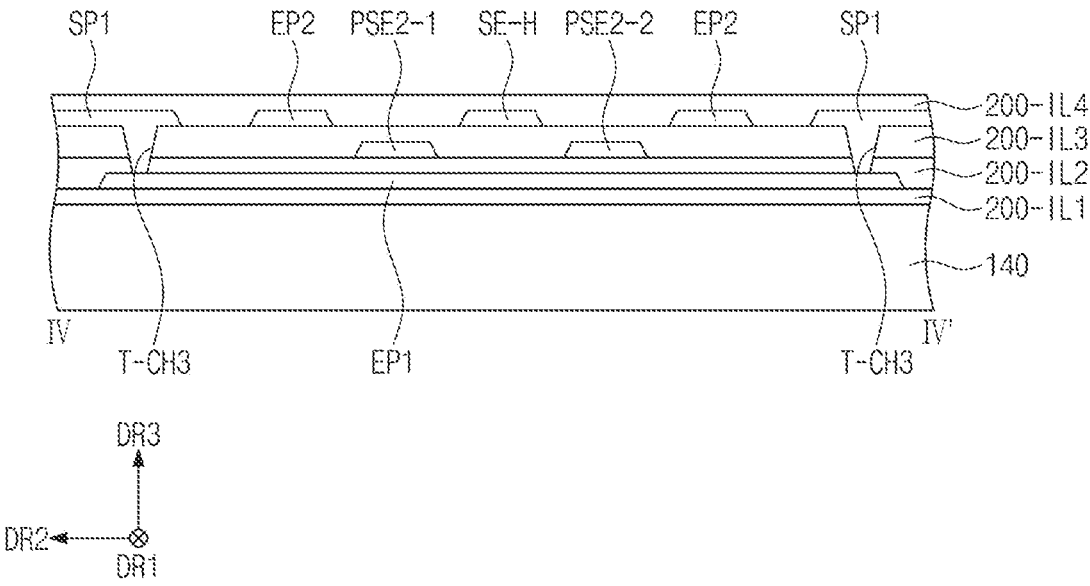
FIG. 10A is a sectional view of the input sensor corresponding to the line IV-IV' illustrated in FIG. 9.
Figure 10B:
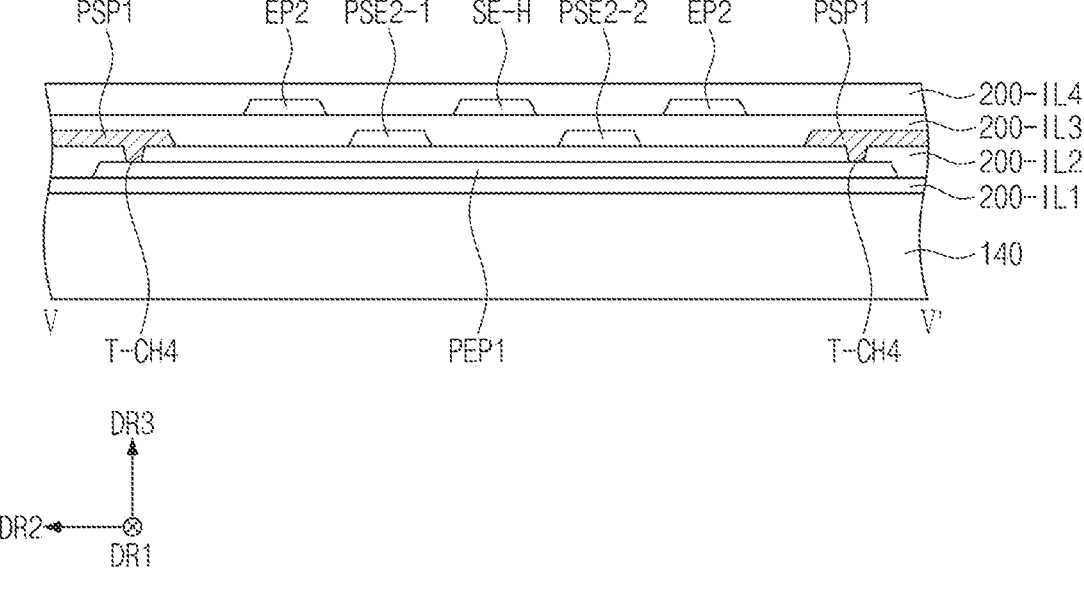
FIG. 10B is a sectional view of the input sensor corresponding to the line V-V' illustrated in FIG. 9.

FIG. 9 is an enlarged plan view of a partial region of the input sensor according to an embodiment of the present disclosure. FIG. 10A is a sectional view of the input sensor corresponding to the line IV-IV' illustrated in FIG. 9. FIG. 10B is a sectional view of the input sensor corresponding to the line V-V' illustrated in FIG. 9.

In the input sensor 200 according to an embodiment, the first sensor layer that senses an external input using an electromagnetic induction method may be disposed under the second sensor layer that senses an external input using a capacitance method.

Referring to FIG. 9, each of the extending portion 1-1 SE1-1 and the extending portion 1-2 SE1-2 of the electrode 2-1 SE1 may include first sensing patterns SP1 arranged along the second direction DR2, and first bridge patterns EP1 (e.g., intersection portions), each of which connects two first sensing patterns SP1 that are adjacent to each other from among the first sensing patterns SP1 to each other.

The first sensing patterns SP1 may have a bent shape. For example, the first sensing patterns SP1 may have a shape that is bent to the left or to the right in the first direction DR1 to maintain a desired distance (e.g., a certain or predetermined distance) from the electrode 1-1 PSE1. For example, the first sensing patterns SP1 disposed on the left side with respect to the electrode 1-1 PSE1 may have the shape of a less than sign ("<"), and the first sensing patterns SP1 disposed on the right side with respect to the electrode 1-1 PSE1 may have the shape of a greater than sign (">"). The first sensing patterns SP1 and the first bridge patterns EP1 may be connected together to define the first recess S-H1 surrounding (e.g., around a periphery of) at least a portion of the electrode 1-1 PSE1. On the plane (e.g., in a plan view), the electrode 1-1 PSE1 may be disposed in the first recess S-H1.

According to an embodiment, the first sensing patterns SP1 may have a greater width than that of the first bridge patterns EP1. However, without being limited thereto, the first sensing patterns SP1 may have the same or substantially the same width as that of the first bridge patterns EP1.

Each of the extending portion 2-1 SE2-1 and the extending portion 2-2 SE2-2 of the electrode 2-2 SE2 may include second sensing patterns SP2 arranged along the first direction DR1, and second bridge patterns EP2, each of which is disposed between two second sensing patterns SP2 that are adjacent to each other from among the second sensing patterns SP2. The second sensing patterns SP2 and the second bridge patterns EP2 may be implemented with a pattern provided as one body or substantially one body, but are described as being distinguished from each other for convenience.

The second sensing patterns SP2 may have a bent shape. For example, the second sensing patterns SP2 may have a shape bent upward or downward in the second direction DR2 to maintain a desired distance (e.g., a certain or predetermined distance) from the electrode 1-2 PSE2. For example, the second sensing patterns SP2 disposed on the upper side with respect to the electrode 1-2 PSE2 may have the shape of an upside-down V ("A"), and the second sensing patterns SP2 disposed on the lower side with respect to the electrode 1-2 PSE2 may have the shape of a V ("v"). The second sensing patterns SP2 and the second bridge patterns EP2 may be connected together to define the second recess S-H2 surrounding (e.g., around a periphery of) at least a portion of the electrode 1-2 PSE2. On the plane (e.g., in a plan view), the electrode 1-2 PSE2 may be disposed in the second recess S-H2.

According to an embodiment, the second sensing patterns SP2 may have a greater width than that of the second bridge patterns EP2. However, without being limited thereto, the second sensing patterns SP2 may have the same or substantially the same width as that of the second bridge patterns EP2.

The electrode 1-1 PSE1 may include third sensing patterns PSP1 arranged along the second direction DR2, and third bridge patterns PEP1, each of which connects two third sensing patterns PSP1 that are adjacent to each other from among the third sensing patterns PSP1 to each other. The third sensing patterns PSP1 may have a shape that is the same as or similar to a rhombic shape protruding leftward and rightward in the first direction DR1.

The electrode 1-2 PSE2 may include an upper pattern PSE2-1 and a lower pattern PSE2-2 that extend in the first direction DR1, and are spaced apart from each other in the second direction DR2. The upper pattern PSE2-1 may have a shape that is the same as or similar to the shape of the second sensing patterns SP2 disposed on the upper side with respect to the electrode 1-2 PSE2 and the second bridge patterns EP2 connecting the adjacent second sensing patterns SP2 to each other.

The lower pattern PSE2-2 may have a shape that is the same as or similar to the shape of the second sensing patterns SP2 disposed on the lower side with respect to the electrode 1-2 PSE2 and the second bridge patterns EP2 connecting the adjacent second sensing patterns SP2 to each other.

The recess P-H surrounding (e.g., around a periphery of) at least a portion of the electrode 2-3 SE-H may be defined between the upper pattern PSE2-1 and the lower pattern PSE2-2. On the plane (e.g., in a plan view), the electrode 2-3 SE-H may be disposed in the recess P-H.

The electrode 2-3 SE-H may be disposed in the recess P-H. A portion of the electrode 2-3 SE-H disposed between the second sensing patterns SP2 facing each other in the second direction DR2 may have a rhombic shape. A portion of the electrode 2-3 SE-H disposed between the second bridge patterns EP2 facing each other in the second direction DR2 may have a straight-line shape that is connected with the rhombic shape and extends in the first direction DR1.

Referring to FIGS. 10A and 10B, the third sensing patterns PSP1, the upper pattern PSE2-1, and the lower pattern PSE2-2 of the first group electrode PSE may be disposed on the second insulating layer 200-IL2. The first sensing patterns SP1, the second sensing patterns SP2, the second bridge patterns EP2, and the electrode 2-3 SE-H of the second group electrode SE may be disposed on the third insulating layer 200-IL3.

The third bridge patterns PEP1 of the first group electrode PSE may be disposed on the first insulating layer 200-IL1. In addition, the first bridge patterns EP1 of the second group electrode SE may be disposed on the first insulating layer 200-IL1.

As illustrated in FIG. 10A, the first sensing patterns SP1 may be disposed in third contact holes T-CH3 defined in the second insulating layer 200-IL2 and the third insulating layer 200-IL3, and may be connected to the first bridge pattern EP1.

As illustrated in FIG. 10B, the third sensing patterns PSP1 may be disposed in fourth contact holes T-CH4 defined in the second insulating layer 200-IL2, and may be connected to the third bridge pattern PEP1.

The lines included in the line groups G-L2 to G-L8, the first bridge patterns EP1, and the third bridge patterns EP3 may be disposed on the first insulating layer 200-IL1 as described above with reference to FIGS. 8A and 8B.

Figure 11:
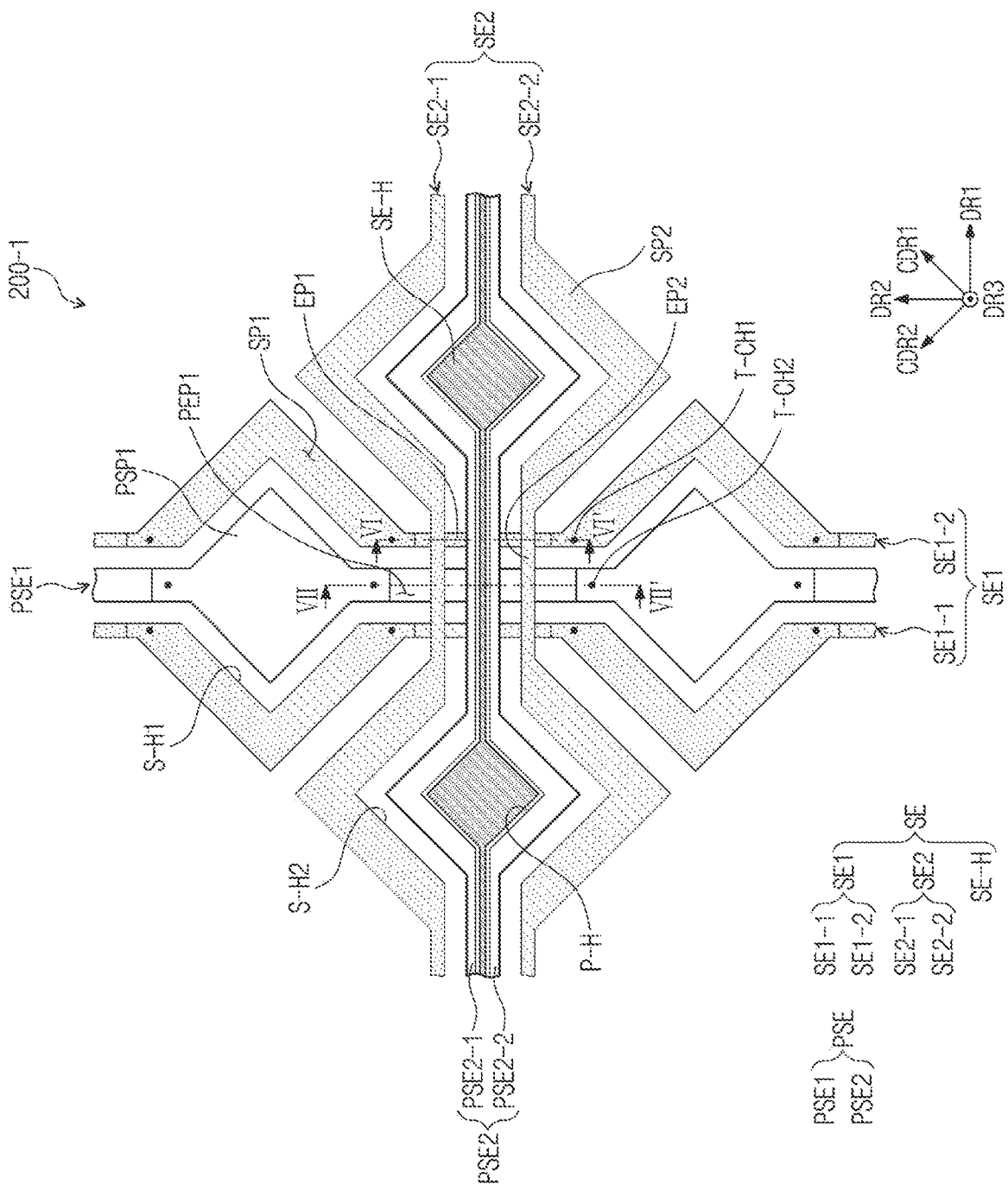
FIG. 11 is an enlarged plan view of a partial region of an input sensor according to an embodiment of the present disclosure.
Figure 12A:
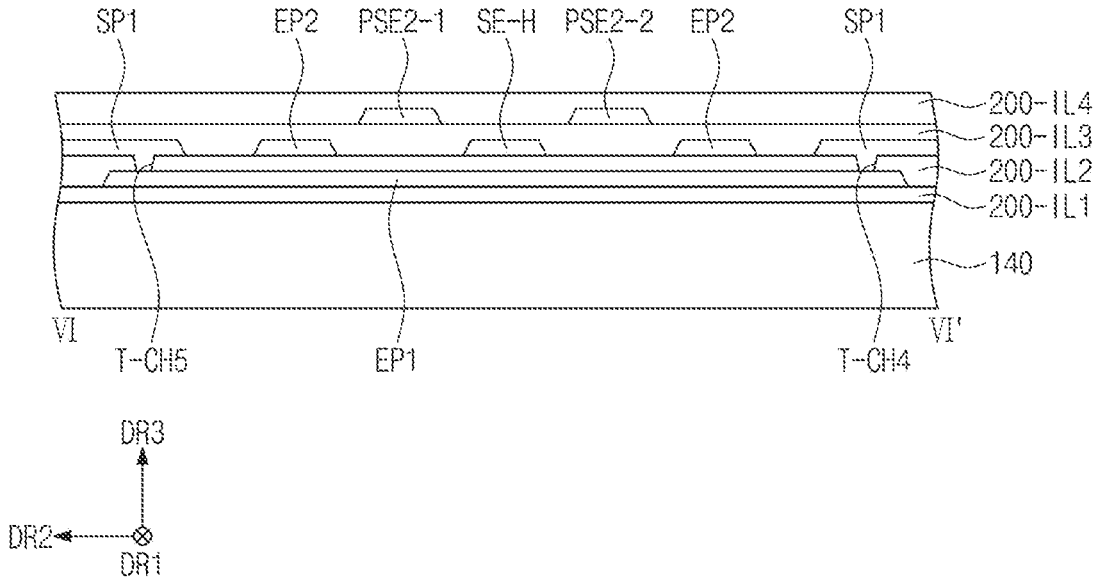
FIG. 12A is a sectional view of the input sensor corresponding to the line VI-VI' illustrated in FIG. 11.
Figure 12B:
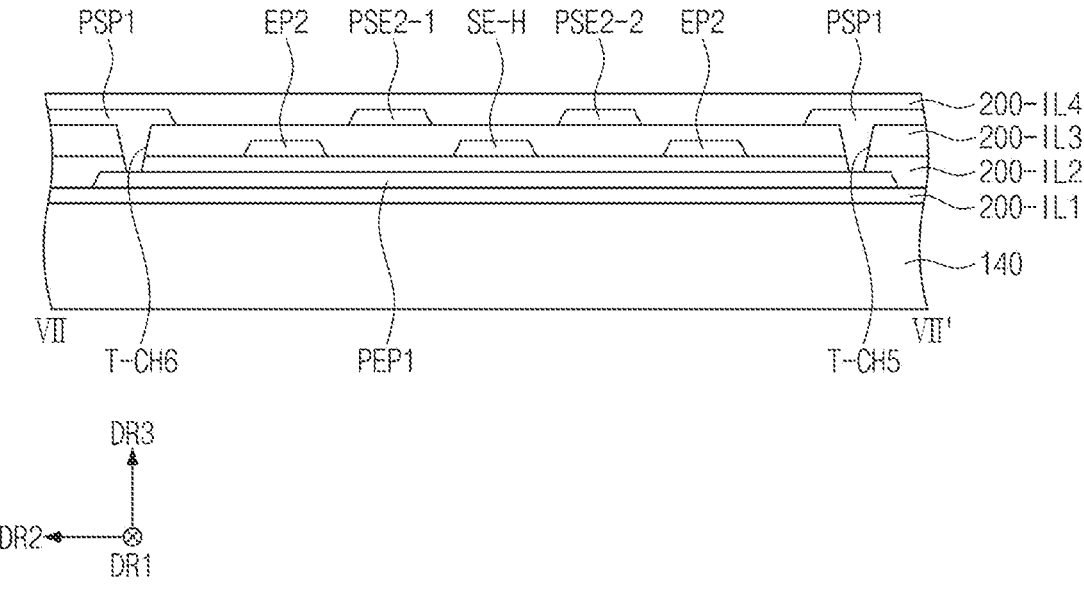
FIG. 12B is a sectional view of the input sensor corresponding to the line VII-VII' illustrated in FIG. 11.

FIG. 11 is an enlarged plan view of a partial region of an input sensor according to an embodiment of the present disclosure. FIG. 12A is a sectional view of the input sensor corresponding to the line VI-VI' illustrated in FIG. 11. FIG. 12B is a sectional view of the input sensor corresponding to the line VII-VII' illustrated in FIG. 11. In FIGS. 11 to 12B, the components that are the same or substantially the same as those described above with reference to FIGS. 8 to 10B are denoted with the same or similar reference numerals, and thus, redundant description thereof may not be repeated.

Referring to FIGS. 11 through 12B, in the input sensor 200-1 according to an embodiment, a first sensor layer that senses an external input using an electromagnetic induction method may be disposed on a second sensor layer that senses an external input using a capacitance method.

Each of an extending portion 1-1 SE1-1 and an extending portion 1-2 SE1-2 of an electrode 2-1 SE1 may include first sensing patterns SP1 arranged along the second direction DR2, and first bridge patterns EP1 (e.g., intersection portions), each of which connects two first sensing patterns SP1 that are adjacent to each other from among the first sensing patterns SP1 to each other.

Each of an extending portion 2-1 SE2-1 and an extending portion 2-2 SE2-2 of an electrode 2-2 SE2 may include second sensing patterns SP2 arranged along the first direction DR1, and second bridge patterns EP2, each of which is disposed between two second sensing patterns SP2 that are adjacent to each other from among the second sensing patterns SP2. The second sensing patterns SP2 and the second bridge patterns EP2 may be implemented with a pattern provided as one body or substantially one body, but are described as being distinguished from each other for convenience.

An electrode 1-1 PSE1 may include third sensing patterns PSP1 arranged along the second direction DR2, and third bridge patterns PEP1, each of which connects two third sensing patterns PSP1 that are adjacent to each other from among the third sensing patterns PSP1 to each other. The third sensing patterns PSP1 may have a shape that is the same as or similar to a rhombic shape protruding leftward and rightward in the first direction DR1.

An electrode 1-2 PSE2 may include an upper pattern PSE2-1 and a lower pattern PSE2-2 that extend in the first direction DR1, and are spaced apart from each other in the second direction DR2. The upper pattern PSE2-1 may have a shape similar to the shape of the second sensing patterns SP2 disposed on the upper side with respect to the electrode 1-2 PSE2 and the second bridge patterns EP2 connecting the adjacent second sensing patterns SP2 to each other.

Referring to FIGS. 12A and 12B, the third sensing patterns PSP1, the upper pattern PSE2-1, and the lower pattern PSE2-2 of the first group electrode PSE may be disposed on a third insulating layer 200-IL3. The first sensing patterns SP1, the second sensing patterns SP2, the second bridge patterns EP2, and an electrode 2-3 SE-H of the second group electrode SE may be disposed on a second insulating layer 200-IL2.

The third bridge patterns PEP1 of the first group electrode PSE may be disposed on a first insulating layer 200-IL1. In addition, the first bridge patterns EP1 of the second group electrode SE may be disposed on the first insulating layer 200-IL1.

As illustrated in FIG. 12A, the first sensing patterns SP1 may be disposed in fifth contact holes T-CH5 defined in the second insulating layer 200-IL2, and may be connected to the first bridge pattern EP1.

As illustrated in FIG. 12B, the third sensing patterns PSP1 may be disposed in sixth contact holes T-CH6 defined in the second insulating layer 200-IL2 and the third insulating layer 200-IL3, and may be connected to the third bridge pattern PEP1.

Figure 13:
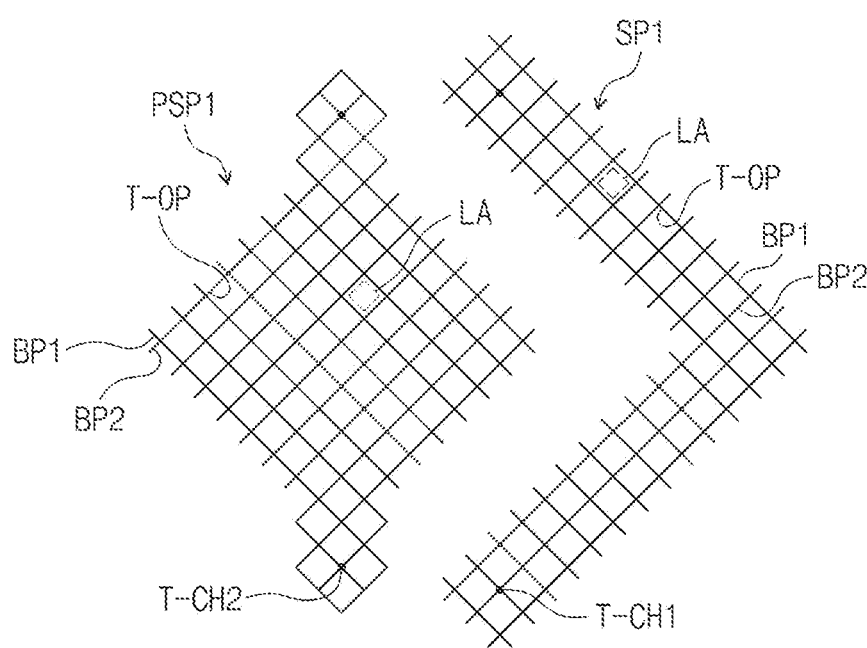
FIG. 13 is an enlarged plan view of a partial region of an input sensor according to an embodiment of the present disclosure.
Figure 13:
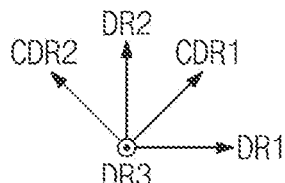

FIG. 13 is an enlarged plan view of a partial region of an input sensor according to an embodiment of the present disclosure. FIG. 13 illustrates an enlarged view (e.g., a blowup) of the first sensing pattern SP1 and the third sensing pattern PSP1 illustrated in FIG. 9. The first sensing pattern SP1 is illustrated to represent the second group electrodes SE, and the third sensing pattern PSP1 is illustrated to represent the first group electrodes PSE.

Referring to FIG. 13, the first sensing pattern SP1 and the third sensing pattern PSP1 may have a mesh shape. For example, each of the first sensing pattern SP1 and the third sensing pattern PSP1 may include first conductive lines BP1 extending in a second crossing direction CDR2, and second conductive lines BP2 extending in a first crossing direction CDR1. The first conductive lines BP1 and the second conductive lines BP2 may be formed through the same or substantially the same process as each other, and may form one body.

A mesh sheet formed of the first conductive lines BP1 and the second conductive lines BP2 may be subjected to patterning to form a portion of the electrode 2-1 SE1, the electrode 2-2 SE2, a portion of the electrode 1-1 PSE1, and the electrode 1-2 PSE2 illustrated in FIG. 9.

Openings T-OP having a rhombic shape may be defined by the first conductive lines BP1 and the second conductive lines BP2. The openings T-OP may correspond to the emissive region LA illustrated in FIG. 6. In other words, the first conductive lines BP1 and the second conductive lines BP2 may overlap with the non-emissive region NLA illustrated in FIG. 6.

Figure 14:
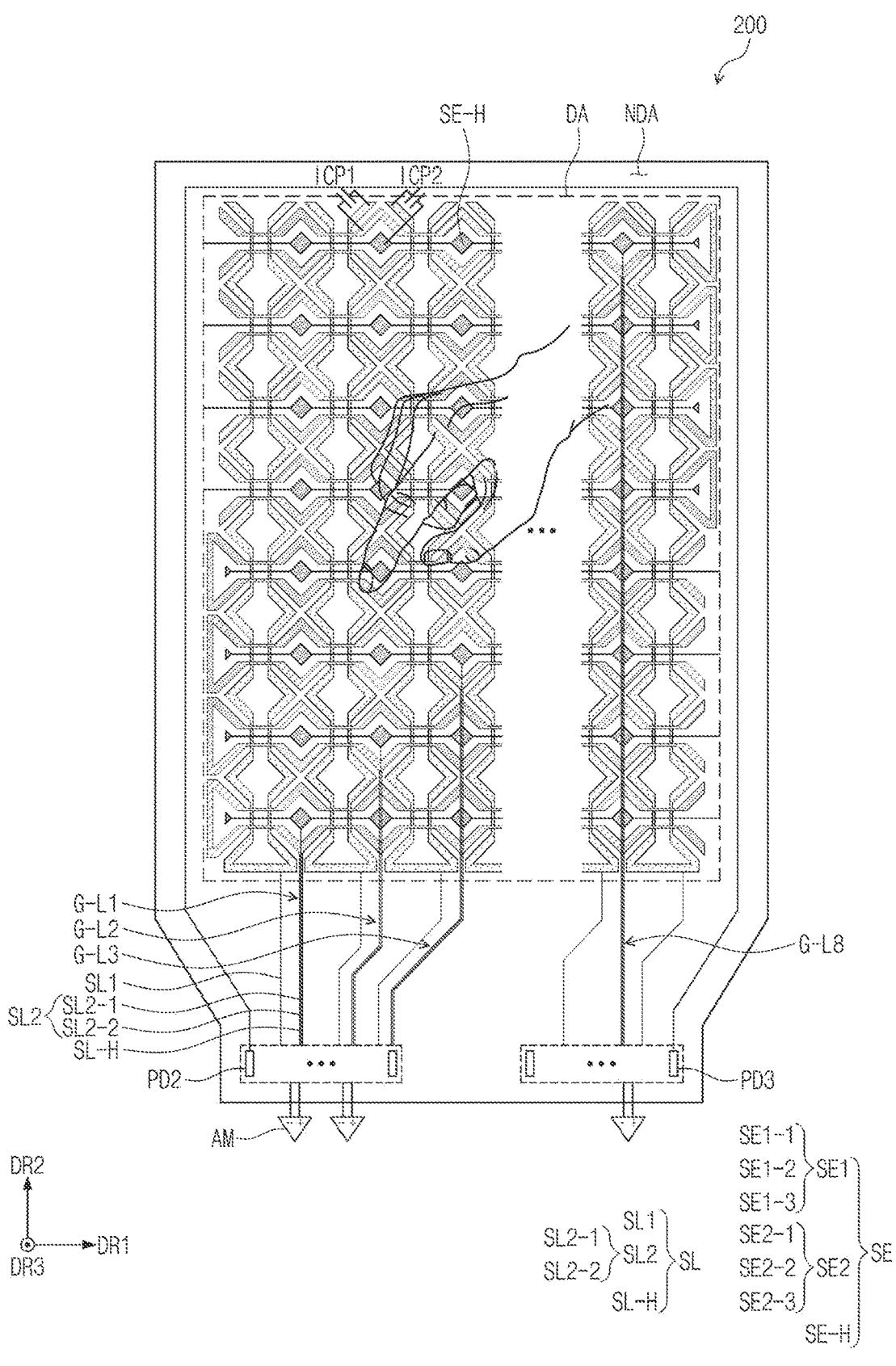
FIG. 14 is a plan view illustrating an operation period of the input sensor that senses an external input using a capacitance method according to an embodiment of the present disclosure.

FIG. 14 is a plan view illustrating an operation period of the input sensor that senses an external input using a capacitance method according to an embodiment of the present disclosure. FIG. 14 is a plan view illustrating the operation period of the second group electrodes SE described above with reference to FIG. 7A.

During the operation period, the first group electrodes PSE described above with reference to FIG. 7A may not be involved in an operation of the input sensor 200. In other words, the input sensor 200 may not provide a drive signal to the first group electrodes PSE, and may not sense a signal from the first group electrodes PSE. For convenience of illustration and simplicity sake, the first group electrodes PSE of FIG. 7A are not illustrated in FIG. 14.

During the operation period, the drive circuit of the input sensor 200 may provide drive signals to the electrodes 2-1 SE1. In other words, the drive circuit of the input sensor 200 may scan the electrodes 2-1 SE1. For example, the drive circuit may sequentially provide the drive signals to the electrodes 2-1 SE1 through the signal lines 2-1 SL1 disposed in the non-display region NDA. Activation periods of the drive signals applied to the electrodes 2-1 SE1 may be different from one another. The drive signals may include a plurality of pulse waves or a plurality of sine waves within the activation periods. The drive circuit of the input sensor 200 that provides the drive signals may be embedded in a separate driver IC of the input sensor 200, or may be embedded in the driver IC DIC (e.g., refer to FIG. 2) mounted on the display panel 100.

Current paths proceeding from the electrodes that receive the drive signals from among the electrodes 2-1 SE1 to the electrodes 2-2 SE2 are formed. The current paths pass through a first capacitor ICP1 formed between the electrodes 2-1 SE1 and the electrodes 2-2 SE2. The amount of change in the capacitance of the first capacitor ICP1 may be detected through the electrodes 2-2 SE2. An external input by the user's body FG (e.g., refer to FIG. 1A) and noise other than the external input by the user's body FG may be included in the amount of change in the capacitance of the first capacitor ICP1 that may be detected through the electrodes 2-2 SE2.

According to one or more embodiments of the present disclosure, current paths proceeding from the electrodes that receive the drive signals from among the electrodes 2-1 SE1 to the electrodes 2-3 SE-H are formed. The current paths pass through a second capacitor ICP2 formed between the electrodes 2-1 SE1 and the electrodes 2-3 SE-H. The amount of change in the capacitance of the second capacitor ICP2 may be detected through the electrodes 2-3 SE-H. Noise may be included in the amount of change in the capacitance of the second capacitor ICP2 that may be detected through the electrodes 2-3 SE-H.

According to the present embodiment, a differential amplifier AM may be connected to sides of the pad parts PD2 and PD3. A difference between the amount of change in the capacitance detected through the electrodes 2-2 SE2 and the amount of change in the capacitance detected through the electrodes 2-3 SE-H may be obtained through the differential amplifier AM. Accordingly, sensing coordinates (e.g., only pure sensing coordinates) other than a noise value generated in the input sensor 200 during the second operation period may be obtained. The sensing coordinates may be coordinates generated by an input of the user's body FG (e.g., refer to FIG. 1A). The sensing circuit of the input sensor 200 may calculate a difference value for a capacitance change through the differential amplifier AM. The sensing circuit of the input sensor 200 may be embedded in a separate driver IC of the input sensor 200, or may be embedded in the driver IC DIC (e.g., refer to FIG. 2) mounted on the display panel 100.

The input sensor 200 according to the present disclosure may remove noise other than an input by the user's body FG (e.g., refer to FIG. 1A) through the electrodes 2-3 SE-H during the second operation period. Accordingly, the input sensor 200 having improved sensing sensitivity may be provided.

Figure 15A:
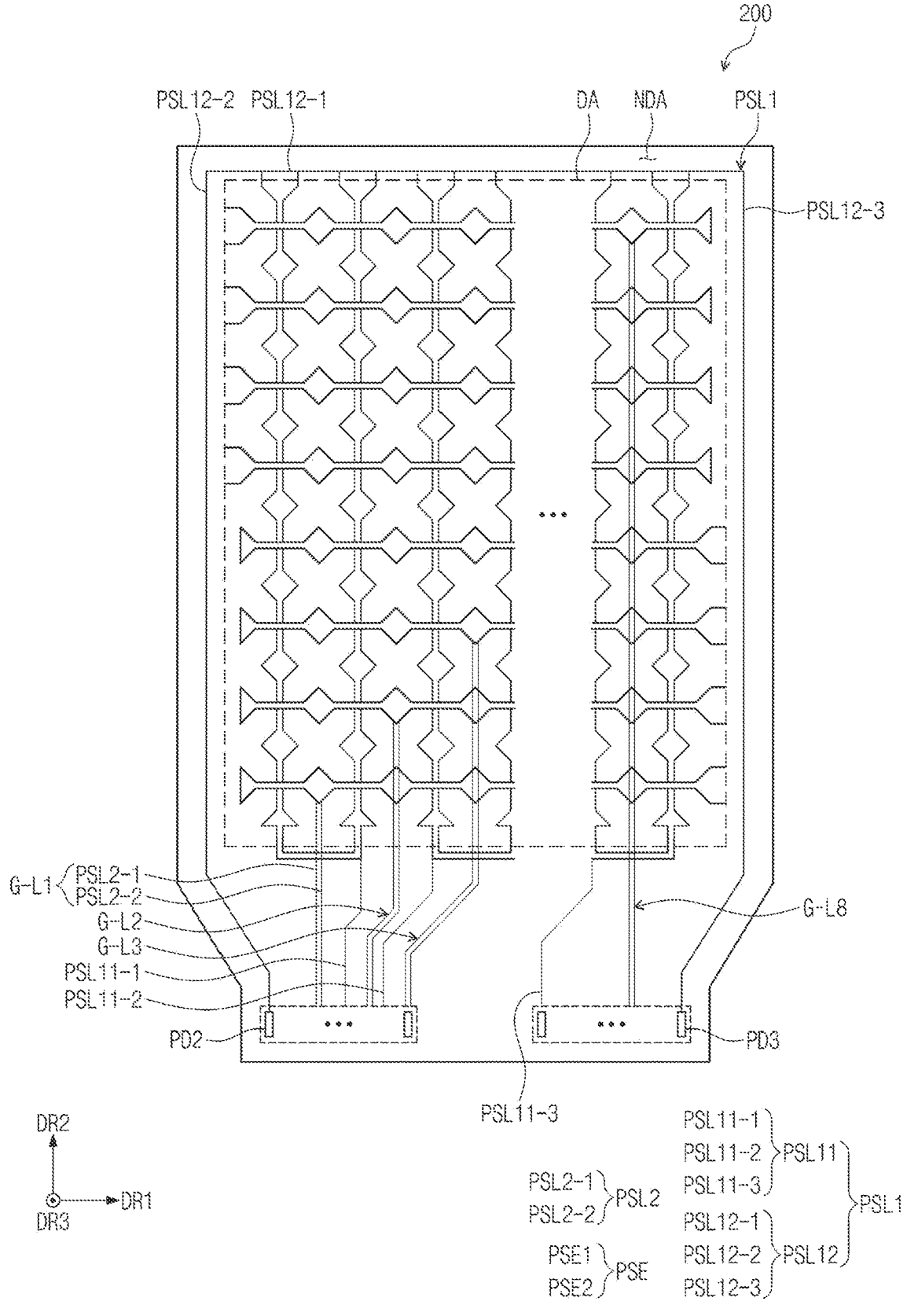
FIGS. 15A-15C are plan views illustrating a charging period of an operation period of the input sensor that senses an external input using an electromagnetic induction method according to an embodiment of the present disclosure.
Figure 15B:
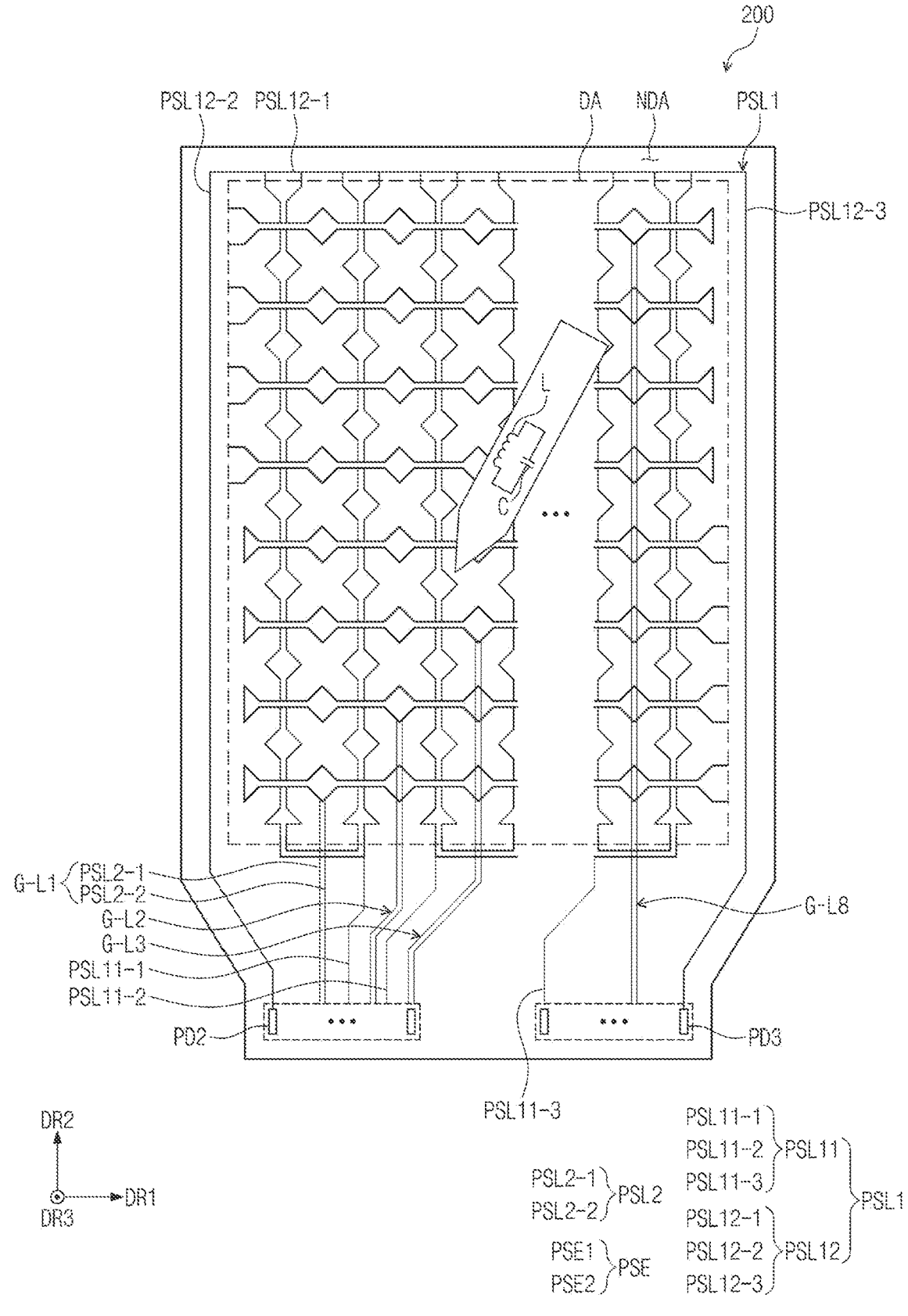
Figure 15C:
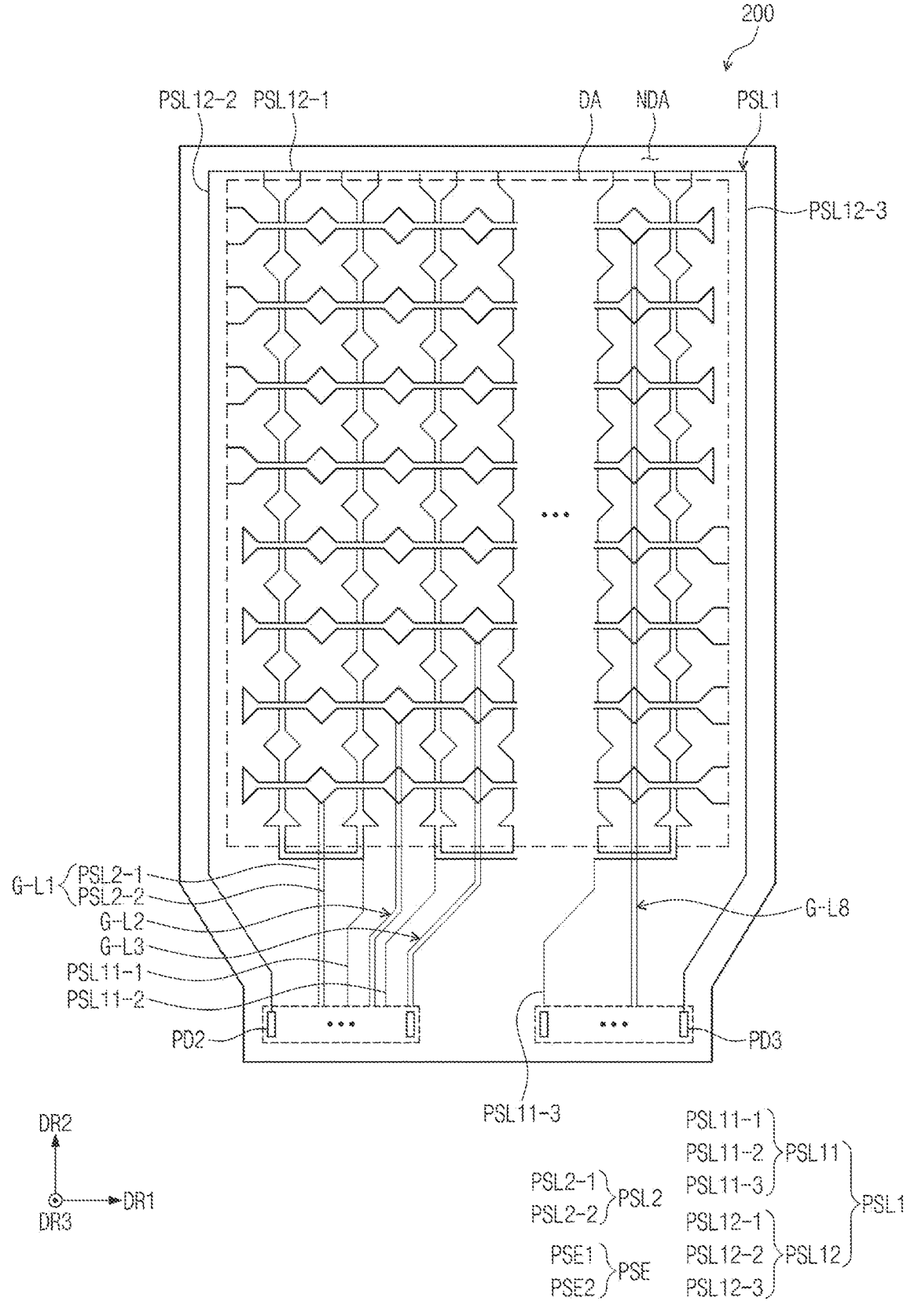
Figure 16:
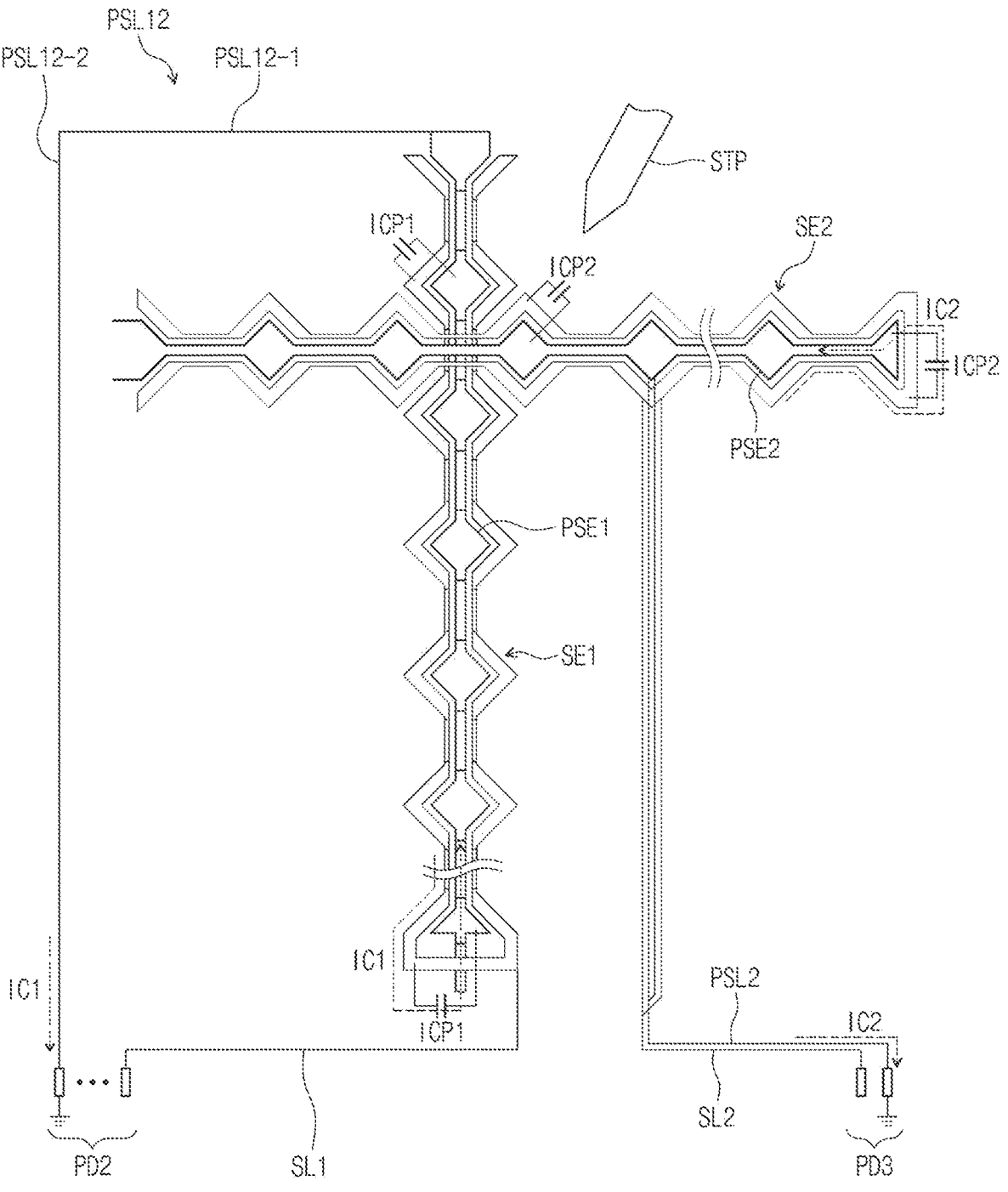
FIG. 16 is a plan view illustrating a sensing period of the operation period of the input sensor that senses the external input using the electromagnetic induction method according to an embodiment of the present disclosure.

FIGS. 15A through 15C are plan views illustrating a charging period of an operation period of the input sensor that senses an external input using an electromagnetic induction method according to an embodiment of the present disclosure. FIG. 16 is a plan view illustrating a sensing period of the operation period of the input sensor that senses the external input using the electromagnetic induction method according to an embodiment of the present disclosure.

FIGS. 15A through 15C are plan views illustrating a charging period of the operation period of the first group electrodes PSE of FIG. 7A. FIG. 16 is a plan view illustrating a sensing period of the operation period of the first group electrodes PSE of FIG. 7A.

During the charging period of the first operation period, the second group electrodes SE of FIG. 7A may not be involved in an operation of the input sensor 200. In other words, a drive signal may not be provided to the second group electrodes SE. For convenience of illustration and simplicity sake, the second group electrodes SE of FIG. 7A are not illustrated in FIGS. 15A to 15C.

In FIGS. 15A through 15C, for convenience of illustration, from among three lines 1-1 PSL11 disposed in the non-display region NDA, the left line 1-1 PSL11 is defined as a first line PSL11-1, the middle line 1-1 PSL11 is defined as a second line PSL11-2, and the right line 1-1 PSL11 is defined as a third line PSL11-3.

According to one or more embodiments of the present disclosure, portions of the first left line PSL2-1 and the first right line PSL2-2 included in each of the line groups G-L1 to G-L8 may be disposed in the display region DA, and the remaining portions thereof may be disposed in the non-display region NDA and may be connected to the corresponding pad parts PD2 and PD3.

During the charging period, the line 1-2 PSL12 may receive a drive signal or a ground voltage from at least one of the second pad part PD2 and/or the third pad part PD3. A part of the first line PSL11-1, the second line PSL11-2, and the third line PSL11-3 may be selected, and the rest thereof may not be selected. The selected line may receive the drive signal or the ground voltage. The electrode 101 PSE1 connected with the selected line may also receive the drive signal or the ground voltage. The unselected lines may be floated. Some of the line 1-2 PSL12, the electrodes 1-1 PSE1, and the line 1-1 PSL11 may be selected, such that a current path may be formed in a coil (e.g., a coil is defined).

Referring to FIG. 15A, during a first period of the charging period, the drive circuit of the input sensor 200 may select the second pad PD2 connected to the line 1-2 PSL12 and the second pad PD2 to which the second line PSL11-2 is connected. The drive circuit of the input sensor 200 applies the drive signal to the second pad PD2 connected to the line 1-2 PSL12, and applies the ground voltage to the second pad PD2 connected to the second line PSL11-2. In this case, the first line PSL11-1 and the third line PSL11-3 may be floated.

The line 1-2 PSL12, the electrode 1-1 PSE1 disposed in the center from among the electrodes 1-1 PSE1, and the second line PSL11-2 may define a current path having a coil shape. The coil-shaped current path may generate a magnetic field.

Referring to FIG. 15B, during a second period of the charging period, the drive circuit of the input sensor 200 may select the second pad PD2 connected to the first line PSL11-1 and the third pad PD3 to which the third line PSL11-3 is connected. The drive circuit of the input sensor 200 may apply the drive signal to the second pad PD2 connected to the first line PSL11-1, and may apply the ground voltage to the third pad PD3 connected to the third line PSL11-3. The first line PSL11-1, the electrode 1-1 PSE1 disposed on the left side from among the electrodes 1-1 PSE1, the line 1-2 PSL12, the electrode 1-1 PSE1 disposed on the right side from among the electrodes 1-1 PSE1, and the third line PSL11-3 may define a current path having a coil shape.

Referring to FIG. 15C, during a third period of the charging period, the drive circuit of the input sensor 200 may select the second pad PD2 connected to the second line PSL11-2 and the third pad PD3 to which the line 1-2 PSL12 is connected. The drive circuit of the input sensor 200 may apply the drive signal to the second pad PD2 connected to the second line PSL11-2, and may apply the ground voltage to the third pad PD3 connected to the line 1-2 PSL12. The second line PSL11-2, the electrode 1-1 PSE1 disposed in the center from among the electrodes 1-1 PSE1, and the line 1-2 PSL12 may define a current path having a coil shape.

During the charging period described above with reference to FIGS. 15A to 15C, a constant or substantially constant voltage may be applied to the electrode 1-2 PSE2 through the signal line 1-2 PSL2. The driving sequence of the charging period described above with reference to FIGS. 15A to 15C is an example, and the present disclosure is not necessarily limited thereto. The operating sequence of the first to third periods may be changed. In addition, two electrodes 1-1 PSE1 that are closest to each other from among the electrodes 1-1 PSE1 may define a portion of a coil-shaped current path.

Referring to FIG. 15B, the resonance circuit of the stylus pen STP may be charged during the second period of the charging period. The resonance circuit of the stylus pen STP disposed on the electrode 1-1 PSE1 in the center receives a magnetic field formed in the current path described above with reference to FIG. 15B. The resonance circuit of the stylus pen STP resonates using a signal received through a change in the magnetic field in the current path described above with reference to FIG. 15B. The resonance circuit of the stylus pen STP may include an inductor L, and a capacitor C connected to the inductor L. An LC resonance circuit may be formed by the inductor L and the capacitor C. The capacitor C may be a variable capacitor having a capacitance that is varied.

FIG. 16 illustrates the sensing period of the first operation period. In FIG. 16, one electrode 2-1 SE1 and one electrode 1-1 PSE1 in which an induced current is generated by a magnetic field signal output from the stylus pen STP are illustrated. An induced current is also generated in the electrode 2-2 SE2 and one electrode 1-2 PSE2 illustrated in FIG. 16 by the magnetic field signal output from the stylus pen STP.

Referring to FIGS. 7A and 16, during the sensing period after the charging period, the sensing circuit of the input sensor 200 may ground the line 1-2 PSL12, and may ground the signal line 1-2 PSL2. Referring to FIG. 16, the ground voltage is applied to the second pad PD2 connected to the line 1-2 PSL12, and the ground voltage is applied to the third pad PD3 connected to the signal line 1-2 PSL2 disposed in the right region. The resonance circuit of the stylus pen STP generates a magnetic field while being discharged. An induced current may be generated in the input sensor 200, which is inductively coupled with the resonance circuit of the stylus pen STP, by the magnetic field emitted from the stylus pen STP.

The first capacitor ICP1 is defined between the electrode 2-1 SE1 and the electrode 1-1 PSE1, and the second capacitor ICP2 is defined between the electrode 2-2 SE2 and the electrode 1-2 PSE2.

As the line 1-2 PSL12 is grounded, a first induced current IC1 flows from the electrode 2-1 SE1 to the electrode 1-1 PSE1 through the first capacitor ICP1. In addition, as the signal line 1-2 PSL2 is grounded, a second induced current IC2 flows from the electrode 2-2 SE2 to the electrode 1-2 PSE2 through the second capacitor ICP2. The sensing circuit of the input sensor 200 may sense the first induced current IC1 through the signal line 1-1 SL1 and the second pad PD2 connected thereto, and may sense the second induced current IC2 through the signal line 2-1 SL2 and the third pad PD3 connected thereto, thereby identifying an input by the stylus pen STP.

In the input sensor 200 according to one or more embodiments of the present disclosure, the first sensor layer that senses an external input using an electromagnetic induction method and the second sensor layer that senses an external input using a capacitance method may be stacked on each other. Accordingly, a relatively slimmer electronic device ED may be provided. In addition, the signal lines connected to some of the electrodes included in the first sensor layer and the second sensor layer may be disposed in the display region DA (e.g., refer to FIG. 7A). Accordingly, the electronic device ED having a reduced dead space may be provided.

According to one or more embodiments of the present disclosure, the first sensor layer that senses an external input using an electromagnetic induction method and the second sensor layer that senses an external input using a capacitance method may be stacked on each other in the input sensor. Accordingly, the relatively slimmer electronic device may be provided.

According to one or more embodiments of the present disclosure, the signal lines connected to some of the electrodes included in the first sensor layer and the second sensor layer may be disposed in the display region. Accordingly, the electronic device having a reduced dead space may be provided. In addition, the electronic device including the input sensor having improved sensing performance may be provided.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. An electronic device comprising:
a display panel including a display region comprising pixels, and a non-display region adjacent to the display region; and
an input sensor on the display panel,
wherein the input sensor comprises:
    first to fourth insulating layers sequentially stacked on the display panel;
    a first sensor layer configured to sense an external input using an electromagnetic induction method, and comprising first group electrodes, some of the first group electrodes being disposed on the second insulating layer and covered by the third insulating layer;
    a second sensor layer configured to sense an external input using a capacitance method, and comprising second group electrodes insulated from the first group electrodes, some of the second group electrodes being disposed on the third insulating layer and covered by the fourth insulating layer;
    a pad part including pads overlapping with the non-display region;
    first signal lines connected to the first group electrodes and the pads, and disposed on the first insulating layer and covered by the second insulating layer; and
    second signal lines connected to the second group electrodes and the pads, and disposed on the first insulating layer and covered by the second insulating layer,
wherein at least some of the first signal lines and the second signal lines overlap with the display region, and
wherein the first group electrodes are connected to the first signal lines through first contact holes defined in the second insulating layer, and the second group electrodes are connected to the second signal lines through second contact holes defined in the second and third insulating layers.

2. The electronic device of claim 1, wherein the first group electrodes comprises:
first-first electrodes located along a first direction, each of the first-first electrodes comprising:
    first-first sensing patterns located along a second direction crossing the first direction; and
    first bridge patterns configured to connect the first-first sensing patterns that are adjacent to each other to each other; and
first-second electrodes insulated from the first-first electrodes, and located along the second direction, each of the first-second electrodes extending in the first direction,
wherein the first signal lines comprise first-first signal lines configured to at least partially overlap with the display region, and first-second signal lines configured to overlap with the non-display region, and
wherein the first-first signal lines are connected to the first-second electrodes.

3. The electronic device of claim 2, wherein the second group electrodes comprise:
second-first electrodes located along the first direction, each of the second-first electrodes comprising second-first sensing patterns located along the second direction, and second bridge patterns configured to connect the second-first sensing patterns that are adjacent to each other to each other;

second-second electrodes insulated from the second-first electrodes, and located along the second direction, each of the second-second electrodes extending in the first direction; and second-third electrodes located along the second direction, and inside the second-second electrodes in a plan view, each of the second-third electrodes extending in the first direction, wherein the second signal lines comprise second-first signal lines configured to at least partially overlap with the display region, and second-second signal lines configured to overlap with the non-display region, and wherein some of the second-first signal lines are connected to the second-second electrodes, and others of the second-first signal lines are connected to the second-third electrodes.

4. The electronic device of claim 3, wherein the first-first signal lines and the second-first signal lines are on the first insulating layer, and covered by the second insulating layer.

5. The electronic device of claim 4, wherein the first bridge patterns and the second bridge patterns are on the first insulating layer, and covered by the second insulating layer.

6. The electronic device of claim 5, wherein the first-first sensing patterns and the first-second electrodes are on the second insulating layer, and covered by the third insulating layer, and wherein the first-first sensing patterns are connected with the first bridge patterns through contact holes defined in the second insulating layer.

7. The electronic device of claim 6, wherein each of the second-first sensing patterns, the second-second electrodes, and the second-third electrodes comprises conductive lines configured to cross each other, and wherein the conductive lines have openings defined therein to overlap with emissive regions through which light generated by the pixels is provided.

8. The electronic device of claim 5, wherein the second-first sensing patterns, the second-second electrodes, and the second-third electrodes are on the third insulating layer, and covered by the fourth insulating layer, and wherein the second-first sensing patterns are connected with the second bridge patterns through contact holes defined in the second insulating layer and the third insulating layer.

9. The electronic device of claim 4, wherein the second-first sensing patterns, the second-second electrodes, and the second-third electrodes are on the second insulating layer, and covered by the third insulating layer, and wherein the second-first sensing patterns are connected with the second bridge patterns through contact holes defined in the second insulating layer.

10. The electronic device of claim 9, wherein the first-first sensing patterns and the first-second electrodes are on the third insulating layer, and covered by the fourth insulating layer, and wherein the first-first sensing patterns are connected with the first bridge patterns through contact holes defined in the second insulating layer and the third insulating layer.

11. The electronic device of claim 3, wherein each of the first-first electrodes comprises one side adjacent to the pad part, and an opposite side facing away from the one side, and wherein one of the first-second signal lines is connected to the opposite side of each of the first-first electrodes.

12. The electronic device of claim 11, further comprising connecting portions configured to connect sides of the first-first electrodes that are adjacent to each other in the first direction from among the first-first electrodes to each other.

13. The electronic device of claim 3, wherein the first-first signal lines and the second-first signal lines located between the second-first electrodes that are adjacent to each other in the first direction are defined as one line group from among a plurality of line groups, and wherein numbers of the first-first signal lines and the second-first signal lines included in each of the plurality of line groups are greater than or equal to 5.

14. The electronic device of claim 13, wherein each of the plurality of line groups comprises:

a first left line and a first right line connected to one of the first-second electrodes, and spaced from each other in the first direction;

a second left line and a second right line connected to a second-second electrode from among the second-second electrodes configured to surround one of the first-second electrodes, the second left line and the second right line being located between the first left line and the first right line; and a center line connected to a second-third electrode from among the second-third electrodes surrounded by one of the first-second electrodes, the center line being located between the second left line and the second right line.

15. The electronic device of claim 14, wherein the center lines included in the plurality of line groups have different widths from each other in the second direction.

16. The electronic device of claim 3, wherein each of the first-second electrodes has an open loop shape, and overlaps with a second-third electrode corresponding thereto from among the second-third electrodes in a plan view, and wherein a recess configured to extend in the first direction is defined in each of the first-second electrodes.

17. The electronic device of claim 16, wherein each of the second-second electrodes has an open loop shape, and overlaps with a first-second electrode corresponding thereto from among the first-second electrodes in a plan view, and wherein a recess configured to extend in the first direction is defined in each of the second-second electrodes.

18. The electronic device of claim 3, wherein each of the second-first electrodes has an open loop shape, and overlaps with a first-first electrode corresponding thereto from among the first-first electrodes in a plan view, and wherein a recess configured to extend in the second direction is defined in each of the second-first electrodes.

19. The electronic device of claim 1, wherein each of the first group electrodes and the second group electrodes comprises first to third layers that are sequentially stacked one above another, the first layer and the third layer having a smaller thickness than that of the second layer, and wherein the first layer and the third layer comprise titanium, and the second layer comprises aluminum.

20. The electronic device of claim 1, wherein the first sensor layer is configured to sense the external input provided from a stylus pen comprising a resonance circuit.

* * * * *